(12) United States Patent
Van Bommel et al.

(10) Patent No.: US 11,543,577 B2
(45) Date of Patent: Jan. 3, 2023

(54) LUMINESCENT CONCENTRATOR WITH CPC, LIGHT GUIDE AND ADDITIONAL PHOSPHOR

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: Signify Holding B.V., Eindhoven (NL)

( * ) Notice: Subject to any disclaimer, the term of this patent is extended or adjusted under 35 U.S.C. 154(b) by 206 days.

(21) Appl. No.: 16/648,614

(22) PCT Filed: Sep. 17, 2018

(86) PCT No.: PCT/EP2018/074997
§ 371 (c)(1),
(2) Date: Mar. 18, 2020

(87) PCT Pub. No.: WO2019/057647
PCT Pub. Date: Mar. 28, 2019

(65) Prior Publication Data
US 2021/0373222 A1 Dec. 2, 2021

(30) Foreign Application Priority Data
Sep. 21, 2017 (EP) ..................... 17192279

(51) Int. Cl.
*F21V 8/00* (2006.01)
*G03B 21/20* (2006.01)

(52) U.S. Cl.
CPC ......... *G02B 6/0003* (2013.01); *G02B 6/0006* (2013.01); *G02B 6/0008* (2013.01); *G03B 21/204* (2013.01); *G03B 21/2013* (2013.01)

(58) Field of Classification Search
CPC ... G02B 6/0003; G02B 6/0006; G02B 6/0008
See application file for complete search history.

(56) References Cited

U.S. PATENT DOCUMENTS 6,631,995 B2 10/2003 Stanton et al.
7,316,497 B2 * 1/2008 Rutherford ............ H04N 9/315
362/600

(Continued)

FOREIGN PATENT DOCUMENTS

CN 10429806 A 10/2008
CN 101868865 A 10/2010

(Continued)

*Primary Examiner* — Arman B Fallahkhair

(57) ABSTRACT

The invention provides a lighting device (1) comprising: —one or more light sources (10) configured to provide light source light (11); —a luminescent element (5) comprising an elongated luminescent body (100) having a radiation input face (111) for receipt of the light source light (11), the luminescent element (5) comprising a first luminescent material (120) for conversion of at least part of the light source light (11) into luminescent material light (8); —a light guide element (850), configured downstream of the first luminescent material (120), and configured to light guide at least part of the first luminescent material light (8); —a second luminescent material (1120), configured downstream of the first 10 luminescent material (120), at a first distance (d1) of at least 0.5 mm thereof, configured to convert one or more of (i) at least part of the light source light (11) and (ii) at least part of the first luminescent material light (8) into second luminescent material light (1128) having a spectral power distribution differing from a spectral power distribution of the first luminescent material light (8); 15—a light transmissive optical element (24) configured downstream of the light guide element (850), configured to receive at least part of the first luminescent material light (8) of the light guide element (850) and to receive at least part of the second luminescent material light (1128), and configured to transmit the received luminescent material light (8) and the received second luminescent material light (1128), and configured to beam shape at least (Continued)

part of the received luminescent material light (8), and to provide lighting device light (101) comprising one or more of the light source light (11), the first luminescent material light (8) and the second luminescent material light (1128).

15 Claims, 7 Drawing Sheets

(56) References Cited

U.S. PATENT DOCUMENTS

| | | | |
|---|---|---|---|
| 7,857,457 B2* | 12/2010 | Rutherford | G03B 21/204 353/31 |
| 8,525,999 B2* | 9/2013 | Brukilacchio | G02B 27/143 356/432 |
| 10,920,939 B2* | 2/2021 | Haenen | F21K 9/68 |
| 10,969,529 B2* | 4/2021 | Ivanova | G02B 6/0003 |
| 10,976,479 B2* | 4/2021 | Denissen | G02B 6/0008 |
| 11,022,869 B2* | 6/2021 | Sakata | G02B 6/0076 |
| 11,101,415 B2* | 8/2021 | Sakata | G02B 6/0003 |
| 11,181,814 B2* | 11/2021 | Sakata | H04N 9/3152 |
| 11,187,970 B2* | 11/2021 | Suzuki | G02F 1/133603 |
| 2007/0279914 A1 | 12/2007 | Rutherford et al. | |
| 2007/0279915 A1* | 12/2007 | Rutherford | H04N 9/3152 362/341 |
| 2008/0079910 A1 | 4/2008 | Rutherford et al. | |
| 2009/0196046 A1* | 8/2009 | Rutherford | F21V 9/00 362/296.02 |
| 2016/0170120 A1 | 6/2016 | Shani et al. | |
| 2016/0377785 A1 | 12/2016 | Chestakov et al. | |
| 2017/0139113 A1 | 5/2017 | Peeters | |
| 2021/0254799 A1* | 8/2021 | Chang | F21V 29/502 |
| 2021/0373222 A1* | 12/2021 | Van Bommel | G02B 6/0003 |

FOREIGN PATENT DOCUMENTS

| | | |
|---|---|---|
| CN | 105324608 A | 2/2016 |
| EP | 1672754 A2 | 6/2006 |
| JP | 2017142381 A | 8/2017 |
| WO | 2006054203 A1 | 5/2006 |
| WO | 2017067781 A1 | 4/2017 |

* cited by examiner

LUMINESCENT CONCENTRATOR WITH CPC, LIGHT GUIDE AND ADDITIONAL PHOSPHOR

CROSS-REFERENCE TO PRIOR APPLICATIONS

This application is the U.S. National Phase application under 35 U.S.C. § 371 of International Application No. PCT/EP2018/074997, filed on Sep. 17, 2018, which claims the benefit of European Patent Application No. 17192279.2, filed on Sep. 21, 2017. These applications are hereby incorporated by reference herein.

FIELD OF THE INVENTION

The invention relates to a lighting device, such as for use in a projector or for use in stage lighting. The invention also relates to a lighting system comprising such lighting device. Yet further, the invention also relates to a projection system or a luminaire comprising such lighting device (and/or such lighting system).

BACKGROUND OF THE INVENTION

Luminescent rods are known in the art. WO2006/054203, for instance, describes a light emitting device comprising at least one LED which emits light in the wavelength range of >220 nm to <550 nm and at least one conversion structure placed towards the at least one LED without optical contact, which converts at least partly the light from the at least one LED to light in the wavelength range of >300 nm to ≤1000 nm, characterized in that the at least one conversion structure has a refractive index n of >1.5 and <3 and the ratio A:E is >2:1 and <50000:1, where A and E are defined as follows: the at least one conversion structure comprises at least one entrance surface, where light emitted by the at least one LED can enter the conversion structure and at least one exit surface, where light can exit the at least one conversion structure, each of the at least one entrance surfaces having an entrance surface area, the entrance surface area(s) being numbered $A_1 \ldots A_n$ and each of the at least one exit surface(s) having an exit surface area, the exit surface area(s) being numbered $E_1 \ldots E_n$ and the sum of each of the at least one entrance surface(s) area(s) A being $A = A_1 + A_2 \ldots + A_n$ and the sum of each of the at least one exit surface(s) area(s) E being $E = E_1 + E_2 \ldots + E_n$.

WO 2017/067781 A1 discloses a lighting device with a light guide having at least two ends and extending in an axial direction between a first base surface at one of the ends of the light guide and a second base surface at another end of the light guide, wherein the light guide comprises a plurality of segments, each of said segments comprising a first light in-coupling surface located on a lateral surface of the light guide for coupling of light into the light guide, and each of said segments being configured to convert at least a part of light input therein into light having a selected wavelength range, and wherein the first base surface comprises a second light in-coupling surface for coupling of light into the light guide and the second base surface comprises a light out-coupling surface for coupling of light out of the light guide. Additionally, there is at least one first light-emitting element configured to emit light of a first wavelength range and being optically coupled to the second light in-coupling surface such that light emitted by the at least one first light-emitting element is coupled into the light guide via the second light in-coupling surface, wherein the at least one first light-emitting element is configured so as to reflect at least part of incident light thereon having a wavelength within at least one of the selected wavelength ranges back into the light guide.

US 2008/079910 A1 discloses a projection system that contains an illumination system having at least a first source of incoherent light capable of generating light in a first wavelength range. The illumination system also includes a body containing a fluorescent material that emits light in a second wavelength range, different from the first wavelength range, when illuminated by light in the first wavelength range. The system further includes at least a second fluorescent material that absorbs light in at least one of the first and second wavelength ranges and emits light in a third wavelength range. The body has an extraction area, and at least some of the light in either the second or third wavelength ranges is internally reflected within the body to the extraction area. Light from the extraction area illuminates at least one image-forming device. Image light from the image-forming device is projected by a projection lens unit onto a screen.

US 2016/170120 A1 discloses an illumination apparatus comprising a substantially planar waveguide having top and bottom, an input region for receiving light, and spatially separated from the input region, an output region for emitting light, the output region comprising at least a portion of the top surface of the waveguide, wherein at least a portion of the waveguide confines light by total internal reflection from an interface between a surface of the waveguide and a surrounding ambient. A light source emits light into the input region. On a surface of the waveguide in the input region, a layer of phosphor material is disposed and on top of that a reflector for reflecting converted and unconverted light back into the input region. an out-coupling structure, disposed in the output region, disrupts total internal reflection of substantially uniform mixed light received from the input region such that the substantially uniform mixed light is emitted from the output region.

SUMMARY OF THE INVENTION

High brightness light sources are interesting for various applications including spots, stage-lighting, headlamps and digital light projection, etc. For this purpose, it is possible to make use of so-called light concentrators where shorter wavelength light is converted to longer wavelengths in a highly transparent luminescent material. A rod of such a transparent luminescent material can be illuminated by LEDs to produce longer wavelengths within the rod. Converted light which will stay in the luminescent material, such as a (trivalent cerium) doped garnet, in the waveguide mode and can then be extracted from one of the (smaller) surfaces leading to an intensity gain.

In embodiments, the light concentrator may comprise a rectangular bar (rod) of a phosphor doped, high refractive index garnet, capable to convert blue light into green light and to collect this green light in a small etendue output beam. The rectangular bar may have six surfaces, four large surfaces over the length of the bar forming the four side walls (herein also indicated as "elongated faces"), and two smaller surfaces at the end of the bar, with one of these smaller surfaces forming the "nose" where the desired light is extracted. Herein, the terms "luminescent material" and "phosphor" relate to the same type of materials, i.e. materials that may luminesce upon excitation (especially with UV or visible radiation). Herein, the first luminescent material may thus especially be excited by the light source light.

Under (e.g. blue light) radiation, the (blue) radiation excites the phosphor, upon which the phosphor emits (green) light in all directions, assuming e.g. some cerium comprising garnet applications. Since the phosphor is embedded in—in general—a high refractive index bar (which is an example of an elongated body, see also below), a main part of the converted (green) light is trapped into the high refractive index bar and wave guided (or "light guided") to the nose of the bar where the (green) light may leave the bar. The amount of (green) light generated is proportional to the amount of blue light pumped into the bar. The longer the bar, the more light sources, such as e.g. blue LED's, can be applied to pump phosphor material in the bar and the number of light sources, such as e.g. blue LED's to increase the brightness of the (green) light leaving at the nose of the bar can be used. The phosphor converted light, however, can be split into two parts.

A first part may essentially consist of first types of light rays that will hit the side walls of the bar under angles larger than the critical angle of reflection. These first light rays are trapped in the high refractive index bar and will traverse to the nose of the bar where it may leave as desired light of the system.

It is desirable to have a lighting device that is able to provide a spectral power distribution that is not solely defined by the luminescent material in the luminescent body. For instance, it may be desirable to provide a lighting device that is able to provide white light, especially with a high power, or to provide saturated light, etc. Further, it is desirable that, would such device be provided, such device is reliable and has the desired minimum lifetime.

For this purpose, it is herein—amongst others—suggested using a transparent light guide and glue it to the luminescent light concentrator and place a further luminescent material at the end of the light guide where it is joined to the CPC. Especially, in embodiments, the light guide and the CPC may be made of the same material. In embodiments, a CPC with a light guide extension is provided, which extension comprises the luminescent material. Such embodiments (and others) may provide a reliable solution.

Hence, it is an aspect of the invention to provide an alternative lighting device comprising a luminescent concentrator, which especially further at least partly obviates one or more of above-described drawbacks and/or which may have a spectral power distribution which may not only be dependent upon the luminescent material that is or can be used in the luminescent concentrator. The present invention may also have as object to overcome or ameliorate at least one of the disadvantages of the prior art, or to provide a useful alternative.

Hence, the invention provides a lighting device ("device") comprising:
- a plurality of light sources configured to provide light source light;
- a luminescent element (or "luminescent concentrator") comprising an elongated luminescent body ("body", or "luminescent body" or "elongated body") having a radiation input face for receipt of the light source light, the luminescent element, more especially the elongated luminescent body, comprising a first luminescent material for conversion of at least part of the light source light into luminescent material light;
- a light guide element ("light guide" or "lighting guide" or "wave guide"), configured downstream of the first luminescent material, and configured to light guide at least part of the first luminescent material light, wherein the light guide element does not comprise a luminescent material;
- a second luminescent material, configured downstream of the first luminescent material, at a first distance (d1) of the first luminescent material (such as at a first distance (d1) of at least 0.5 mm of the first luminescent material), and configured downstream of the light guide element, and wherein the second luminescent material is configured to convert one or more of (i) at least part of the light source light and (ii) at least part of the first luminescent material light into second luminescent material light having a (second) spectral power distribution differing from a (first) spectral power distribution of the first luminescent material light;
- a light transmissive optical element configured downstream of the light guide element, configured to receive one or more of (i) at least part of the first luminescent material light of the light guide element and (ii) at least part of the second luminescent material light, especially configured to receive at least part of the first luminescent material light of the light guide element and to receive at least part of the second luminescent material light, and configured to provide lighting device light comprising one or more of the first luminescent material light and the second luminescent material light;
- wherein the radiation input face is configured parallel to a body axis of the elongated luminescent body, and wherein the light sources are configured to provide light source light only to the elongated luminescent body.

The wording "the light sources are configured to provide light source light only to the elongated luminescent body" means that light from the light sources is not directly coupled into the light guide element. It may be that at least part of the light that is coupled by the light sources into the elongated luminescent body is not converted in the elongated luminescent body and subsequently coupled out of the elongated luminescent body into the light guide element.

Optionally, the lighting device light may also comprise light source light (which has especially propagated through at least part of at least the elongated luminescent body (and at least part of the light guide element)). Especially, the light transmissive optical element is configured to transmit the received luminescent material light and the received second luminescent material light. Further, especially the light transmissive optical element is configured to beam shape at least part of the received luminescent material light, and optionally also at least part of the received second luminescent material light. Hence, the lighting device may—during operation—provide lighting device light, which emanates from the light transmissive optical element. Further, in embodiments the light transmissive optical element may also be configured to beam shape (remaining) light source light, which may remain after transmission through the elongated body and the light guide element (and second luminescent material).

Such lighting device allows a high intensity of light generated by the lighting device. Further, such lighting device allows the generation of white light or e.g. saturated light. As a limited number of luminescent materials may be used for the luminescent element, the present lighting device also allows a broader spectrum of colors than a lighting device with only the first luminescent material of the luminescent element. Further, such lighting device may allow a reliable coupling between the light guide element and the light transmissive optical element and/or between the elongated luminescent body and the light guide element.

As indicated above, the lighting device comprises one or more light sources configured to provide light source light. In specific embodiments, the lighting device comprises a plurality of light sources. All light sources may be configured to pump the first luminescent material. However, also one or more further light sources may be used for other purposes, such as to provide emissions additional to the first luminescent material light and/or light source light, or may optionally be used for pumping the second luminescent material (though especially via the elongated body and (optionally) at least part of the light guide element).

The light source(s) may especially be solid-state light sources, such as light emitting diodes and/or laser diodes (see also below). Hence, in embodiments where a plurality of light sources is applied, the light sources may be from the same bin. The light sources may (thus) essentially have essentially the same spectral power distributions of the light they generate. The elongated body may thus radiationally be coupled to the one or more light sources. The (intensity of the) light sources may be control by a control system.

The luminescent element comprises an elongated luminescent body having a radiation input face for receipt of the light source light. Hence, each elongated luminescent body is radiationally coupled with a set of (one or more) light sources (see also above). The luminescent body may also include a plurality of radiation input faces. Hence, the term "radiation input face" may also refer to a plurality of radiation input faces. Further, instead of the term "radiation input face" also the term "radiation entrance face" or the term "radiation entrance surface" may be applied.

In specific embodiments, the light source light of at least one of the one or more light sources is provided to a radiation input face essentially parallel to a body axis of the elongated body, i.e. an elongated side face. Especially, a plurality of light sources is configured to provide light source light to such (elongated) radiation input face. This may especially be the case when LEDs are applied. In alternative embodiments, especially when laser diodes are applied, light source light may be provided to a radiation input face configured essentially perpendicular to a body axis, i.e. a head or tail face of the elongated body. Of course, also combinations of such embodiments may be applied.

The body axis may also be indicated as axis of elongation. In a cylindrical embodiment, this may be a cylinder axis. Especially, in embodiments the axis of elongation has a length equal to the length of the body (or element).

The luminescent element may have a luminescent element exit window ("radiation exit window") for the first luminescent material light. The radiation exit window may in embodiments be configured essentially perpendicular to a body axis, i.e. a head or tail face of the elongated body. In yet other embodiments, which may be combined with the former embodiments (of being configured essentially perpendicular to the body axis), the radiation exit window is configured essentially perpendicular to an (elongated) radiation input face.

This radiation exit window may essentially be a face, or a part of a face, from which the first luminescent material light may propagate from a first material to a second material. The body may essentially be a luminescent body. Further embodiments are described in more detail below.

The luminescent element comprises a first luminescent material for conversion of at least part of the light source light into luminescent material light. The term "luminescent material" may also refer to a plurality of different luminescent materials. Examples of luminescent materials are indicated below.

The device further comprises a light guide element, configured downstream of the first luminescent material, and configured to light guide at least part of the first luminescent material light. As indicated below, in specific embodiments the light guide element is configured downstream of the elongated body. The term "to light guide" may also be replaced by "to wave guide", and especially refers allowing propagation of the light through a (solid) optical medium, such as a ceramic body, or a polymeric body, or a single crystalline body. The light guide element comprises a light transmissive material. More especially, the light guide element essentially consists of light transparent material. Especially, the light guide element may comprise one or more of a glass, a ceramic, a silicone, and a single crystal, especially one or more of a glass, a ceramic, and a single crystal. Optionally, the light guide element comprises a polymeric material.

Examples of suitable light transmissive materials, more especially light transparent materials, are (also) indicated below, e.g. also in relation to a host material that can be used to host the first luminescent material. Desirable conditions for the light guide element in terms of transmission and/or mean free path for the wavelength of interest may in embodiments be essentially identical as those which may apply to the host material, i.e. e.g. one or more of (i) the transmission for a wavelength of interest may be at least 80%/cm, such as at least 90%/cm, even more especially at least 95%/cm, such as at least 98%/cm, such as at least 99%/cm, and (ii) a mean free path, only taking into account scattering effects, for a wavelength of interest may be at least 5 mm, such as at least 10 mm.

In first embodiments, the light guide element may be a separate body, configured between the elongated body and the light transmissive optical element. In such embodiments, the luminescent element may have a luminescent element exit window configured upstream of a light guide element entrance window. In such embodiments, the luminescent element exit window (of the luminescent element) and the radiation exit window (of the elongated body) may essentially coincide.

Further, in such embodiments (but also in other embodiments, see e.g. also below), the light guide element may have a light guide element input surface (which may also be indicated as light guide element entrance surface or light guide element entrance window), and a light guide element output surface (which may also be indicated as light guide element exit surface or light guide element exit window).

Further, in such embodiments (but also in other embodiments, see e.g. also below), the luminescent element exit window may especially be in optical contact with the light guide element entrance window. Hence, the elongated body and the light guide element may be optically coupled. Especially, the light guide element and the optical element are optically coupled.

In second embodiments, the light guide element and the elongated body may be configured as single body. For instance, the light guide element may be an extension of the elongated body but without or with only a relatively low concentration of the first luminescent material. For instance, the elongated body may comprise a garnet material doped with cerium and the light guide element may be essentially the same garnet material, but not doped with cerium, or with only a relatively low concentration. Such combination of elongated body and the light transmissive optical element may also be produced as single body. In such embodiments, the light guide element may include the luminescent element exit window. Hence, the radiation exit window of the light guide may effectively be configured as luminescent element exit window, as there is essentially no physical window between the elongated body with luminescent material and the light guide element. In such embodiments, the elongated body and the light guide element may essentially optically coupled per se, as they are configured as a single body, such as a single rod. Especially, the light guide element and the optical element are optically coupled.

Yet in third embodiments, the light guide element and the light transmissive optical element may be configured as single body. For instance, the light guide element may be an extension of the light transmissive optical element. For instance, the light transmissive optical element may be glass or a ceramic (body) and the light guide element is thus the same material. Such combination of light guide element and the light transmissive optical element may also be produced as single body. In such embodiments, the luminescent element may have a luminescent element exit window configured upstream of a light guide element entrance window. In such embodiments, the luminescent element exit window and the radiation exit window (of the elongated body) may essentially coincide. Further, in such embodiments light, such as luminescent material light, may propagate from the light guide element entrance window to a light transmissive optical element exit window, as there is essentially no physical window between the light guide element and the light transmissive optical element. Hence, in embodiments the light guide element and the light transmissive optical element are a single body, (essentially) consisting of the same material.

Hence, in embodiments the luminescent element exit window (of the elongated body) and the radiation exit window (of the luminescent element) may essentially coincide. Hence, the elongated body and the light guide element are especially optically coupled. In such embodiments, the light guide element and the optical element may essentially optically coupled per se, as they are configured as a single body.

In yet further (fourth) embodiments, the elongated body, the light guide element, and the light transmissive optical element may be configured as single body. For instance, the light guide element may be an extension of the elongated body but without or with only a relatively low concentration of the first luminescent material, with—in embodiments—at another end the light transmissive optical element. For instance, the elongated body may comprise a garnet material doped with cerium and the light guide element may be essentially the same garnet material, but not doped with cerium, or with only a relatively low concentration. Likewise, the light transmissive optical element may be essentially the same garnet material, but not doped with cerium, or with only a relatively low concentration. Such combination of elongated body, light guide element the light transmissive optical element may also be produced as single body. In such embodiments, light, such as luminescent material light, may propagate from the elongated luminescent body to a light transmissive optical element exit window, as there are essentially no physical windows between the elongated luminescent body and the light guide element and the light guide element and the light transmissive optical element.

In such embodiments, the elongated body, the light guide element and the optical element may essentially optically coupled per se, as they are configured as a single body.

Hence, in specific embodiments the first luminescent material may be available in the elongated luminescent body with a first concentration c1, and the same luminescent material is available in the light guide element with a second concentration c2, wherein $0 \leq c2/c1 \leq 0.05$, such as $0 \leq c2/c1 \leq 0.01$. Hence, in embodiments the first luminescent material is not available in the light guide element ($c2/c1=0$).

Likewise, in specific embodiments the first luminescent material may be available in the elongated luminescent body with a first concentration c1, and the same luminescent material is available in the light transmissive optical element with a third concentration c3, wherein $0 \leq c3/c1 \leq 0.05$, such as $0 \leq c3/c1 \leq 0.01$. Hence, in embodiments the first luminescent material is not available in the light transmissive optical element ($c3/c1=0$).

As indicated above, the term "luminescent material" may also refer to a plurality of different luminescent materials. In such embodiments, the above conditions may apply to each luminescent material.

Further, the fact that the elongated luminescent body comprises a first luminescent material and the light guide element (and/or light transmissive optical element) does essentially not comprise such luminescent material, does not exclude the availability of another luminescent material in the light guide element (and/or light transmissive optical element), which other luminescent material is thus essentially not available in the elongated body. However, with respect to the light guide element, whether or not this light guide element comprises any luminescent material, the transmission for a wavelength of interest may be at least 80%/cm, such as at least 90%/cm, even more especially at least 95%/cm, such as at least 98%/cm, such as at least 99%/cm, and (ii) a mean free path, only taking into account scattering effects, for a wavelength of interest may be at least 5 mm, such as at least 10 mm.

Hence, in operation the light source(s) excite the first luminescent material and luminescent material may propagate through the elongated body and subsequently through the light guide element. Finally, the first luminescent material light escapes from the light transmissive optical element. Optionally, at least part of the first luminescent material light may propagate through the second luminescent material. Also optionally, at least part of the light source light may propagate through the second luminescent material. However, in other embodiments essentially all light source light, such as at least 99% (of all photons), like at least 99.5% of all light source light is absorbed by the first luminescent material or by the first luminescent material and the second luminescent material.

Therefore, as indicated above, the lighting device further comprises a second luminescent material, configured downstream of the first luminescent material. This implies that the second luminescent material may e.g. be comprised by the light guide element and/or may be configured between the light guide element and the optical element and/or may be comprised by the optical element.

The term "second luminescent material" may also refer to a plurality of different second luminescent materials. In such embodiments, the above conditions may apply to each second luminescent material. The second luminescent material may be configured at a single position, such as between the light guide and the optical element, but may also be configured at different positions.

However, especially the second luminescent material is configured downstream of the first luminescent material, such as at a first distance (d1) of at least 0.5 mm thereof. Especially, the first distance (d1) (between the second luminescent material and the first luminescent material) may be larger than 0 mm. More especially, the first distance (d1) (between the second luminescent material and the first luminescent material) may be selected from the range of 1-20 mm. In specific embodiments, the second luminescent material is configured downstream of the luminescent body. Alternatively or additionally, the second luminescent material may be configured downstream of at least part of the light guide element. The phrase "downstream of at least part of the light guide element" indicates e.g. embodiments wherein the second luminescent material is configured between the light guide element and the optical element, but also embodiments wherein the second luminescent material is comprised, e.g. as body (see also below) in the light guide element, but not directly downstream of the elongated body, but at some distance. In this way, at least part of the length of the light guide is in between the elongated body and the second luminescent material. In this way, luminescent material light and optionally light source light may in embodiments only reach the second luminescent material after propagation through at least part of the light guide element.

Especially, it appears beneficial when the second luminescent material is configured closer to the optical element than to the elongated body. Therefore, this first distance is applied, indicating that there is at least some distance relative to the first luminescent material, irrespective whether the second luminescent material is available in an extension of the elongated body or in a light guide element that is a separate body. For instance, the first luminescent material can be configured at the end of the light guide element (i.e. close to the optical element) (and/) or may be configured between the light guide element and the optical element. Such configurations allow the second luminescent material not to be subjected to relative high temperatures (generated in the luminescent elongated body). Further, such configurations also alternatively or additionally allow a connection between the light guide element and the optical element not to be subjected to relative high temperatures. Hence, a more reliable device may be created.

The second luminescent material is especially configured to convert one or more of (i) at least part of the light source light and (ii) at least part of the first luminescent material light into second luminescent material light. Hence, the second luminescent material will in general provide second luminescent material light that is Stokes shifted relative to the light source light (as will in general also be the case for the first luminescent material light) and optionally also relative to the first luminescent material light in embodiments wherein the second luminescent material light (also) converts at least part of the first luminescent material light. Herein, the second luminescent material may thus especially be excited by the light source light and/or the first luminescent material light of the first luminescent material. The second luminescent material is (thus) configured downstream of the first luminescent material.

When the second luminescent material converts light source light, this is especially essentially only light source light that reaches the second luminescent material via the elongated body and (at least part of) the light guide element. Especially, there is no receipt of direct light source light. Therefore, in specific embodiments no light sources are configured to provide light source light directly to the light guide element.

Hence, in specific embodiments the light source(s) is (are) especially configured to provide light source light essentially only to the elongated luminescent body. Especially, essentially all light source light (such as at least 90% of all photons generated by the light source(s)) may be received by the radiation input face, and is thus not directly received by e.g. the light guide element. In embodiments wherein the second luminescent material converts light source light, the light source(s) may be configured to radiate a side face of the elongated body. In other embodiments, the light source(s) may be configured to radiate an end face.

Hence, in embodiments the same (type of) light source(s) may be applied to excite the first luminescent material and the second luminescent material.

In other embodiments, which may be combined with the former embodiments, different types of) light source(s) may be applied to excite the first luminescent material and the second luminescent material. For instance, blue LEDs may be used to side lit the elongated body for generation of the first luminescent material light, and a solid-state (laser) light source may be configured to irradiate an end face of the elongated body, which light thereof primarily excites the second luminescent material.

Especially, the second luminescent material light has a spectral power distribution differing from a spectral power distribution of the first luminescent material light. Hence, the color point of the first luminescent material light and the second luminescent material light differ. For instance, the x values and/or y values in the CIE 1931 diagram of the first luminescent material and the second luminescent material may differ at least with a value of 0.05, like at least 0.1.

The light guide element may optionally also be used as light mixing element, especially when there is remaining light source light (after propagation through the elongated body).

As further indicated above, the lighting device comprises a light transmissive optical element configured downstream of the light guide element, configured to receive at least part of the first luminescent material light of the light guide element and/or to receive at least part of the second luminescent material light, especially configured to receive at least part of the first luminescent material light of the light guide element and to receive at least part of the second luminescent material light. Especially, the light transmissive element is configured to transmit the received luminescent material light and the received second luminescent material light. The received light especially leaves the light transmissive optical element at an exit window thereof. Hence, as indicated above, especially the light transmissive optical element is configured to beam shape at least part of the received luminescent material light, and optionally also at least part of the received second luminescent material light.

In specific embodiments, the optical element is selected from the group of a collimator, such as a CPC-like collimator, and a lens.

The optical element may especially comprise a collimator used to convert (to "collimate") the light beam into a beam having a desired angular distribution.

Further, the optical element may especially comprise a light transmissive body comprising the radiation entrance window. Hence, the optical element may be a body of light transmissive material that is configured to collimate the converter radiation from the luminescent body.

In specific embodiments, the optical element comprises a compound parabolic like collimator, such as a CPC (compound parabolic concentrator).

A massive collimator, such as a massive CPC, may especially be used as extractor of light and to collimate the (emission) radiation. Alternatively, one may also configured a dome with optical contact (n>1.00) on the nose of the rod or a hollow collimator, such as a CPC, to concentrate the (emission) radiation.

The optical element may have cross section (perpendicular to an optical axis) with a shape that is the same as the cross-section of the luminescent body (perpendicular to the longest body axis (which body axis is especially parallel to a radiation input face). For instance, would the latter have a rectangular cross section, the former may also have such rectangular cross section, though the dimension may be different. Further, the dimension of the optical element may vary over its length (as it may have a beam shaping function).

Further, the shape of the cross-section of the optical element may vary with position along the optical axis. In a specific configuration, the aspect ratio of a rectangular cross-section may change, especially monotonically, with position along the optical axis. In another preferred configuration, the shape of the cross-section of the optical element may change from round to rectangular, or vice versa, with position along the optical axis.

Hence, especially the optical element is configured to beam shape at least part of the received luminescent material light. In specific embodiments, the optical element is especially configured to collimate at least part of the received luminescent material light, and optionally also at least part of the received second luminescent material light. Therefore, in embodiments the light transmissive optical element comprises a compound parabolic collimator.

Therefore, in embodiments the optical element may be configured for one or more of (i) facilitating extraction of luminescent material light via an exit window to the optical element (such as especially light extraction from the light guide element), and (ii) beam shaping luminescent material light emanating from an exit window (such as especially light extraction from the light guide element).

Therefore, the lighting device is configured to provide lighting device light comprising one or more of the light source light, the first luminescent material light and the second luminescent material light, especially at least the first luminescent material light and the second luminescent material light.

Below, some further embodiments are described.

In embodiments, the light guide element and the light transmissive optical element comprise the same material. In embodiments, they may even essentially consist of the same material. In specific embodiments, the light guide element and the light transmissive optical element both comprise one or more materials selected from the group consisting of a glass, sapphire, quartz, a ceramic material, an (essentially) undoped garnet, a single crystalline material, etc. However, polymeric materials may also be possible.

Especially, in embodiments the elongated luminescent body and the light transmissive optical element may have different material compositions. For instance, the former may comprise a garnet material, in embodiments doped with cerium. Would the light guide element and/or the light transmissive optical element also comprise a garnet material (essentially) undoped with luminescent species, then the elongated luminescent body and the light transmissive optical element may have similar material compositions.

The elongated luminescent body and the light guide element are especially optically coupled (assuming they are different elements, and not one being an extension of the other). Likewise, the light guide element and the light transmissive optical element may be optically coupled (assuming they are different elements, and not one being an extension of the other). When one element is an extension of the other, the elongated body may optically be coupled to the light guide element (when the latter is an extension of the optical element), or the light guide element may be optically coupled to the light transmissive optical element (when the former is an extension of the elongated luminescent body), respectively.

For instance, for optical coupling physical contact may be applied (see also below). Alternatively, a silicone glue may be used to connect (and optically couple) the two elements. Alternatively, a (glass) frit may be applied to connect (and optically couple) the two elements. Alternatively, for optical coupling of two elements, the average distance between the two elements may be about at maximum the wavelength of relevance, such as the wavelength of an emission maximum of the first luminescent material (see also below).

Different positions may be chosen to configure the second luminescent material. Optionally, in a device two or more positions (with different d1 values) may be chosen to configure the second luminescent material.

In embodiments, the lighting device comprises a luminescent material layer configured between the light guide element and the light transmissive optical element, wherein the luminescent material layer comprises the second luminescent material. In such embodiments, the second luminescent material is configured at a distance which may be essentially equal to the length of the light guide element. The luminescent layer may be a coating. The luminescent layer may comprise a host material comprising the second luminescent material. The luminescent layer may also be a body, like a platelet (see also below).

Alternatively or additionally, the light transmissive optical element comprises the second luminescent material. Would the second luminescent material be embedded in the light transmissive optical element, especially this may not be over the entire length, but at some distance (first distance d1) from the first luminescent material, such as at such distance from the elongated body.

Alternatively or additionally, the light transmissive optical element may comprise the second luminescent material. For instance, in embodiments the light transmissive optical element comprises an optical element cavity configured to beam shape at least part of the first luminescent material light received via the light guide element, wherein the optical element cavity comprises the second luminescent material.

As indicated above, in embodiments the second luminescent material may be comprised by a body, like a platelet. Hence, in specific embodiments the lighting device further comprises a second luminescent body comprising the second luminescent material, wherein one or more of the light guide element and the light transmissive optical element comprise a receptor cavity for hosting the second luminescent body. This may also allow producing a single body comprising the light guide element and the light transmissive optical element, or a single body comprising the elongated body and the light guide element, or a single body comprising the elongated body, the light guide element and the optical element, having such receptor cavity. The receptor cavity may especially be configured to host the second luminescent body, even more especially the receptor cavity may be configured to host the second luminescent body in an interference fit. An interference fit, also known as a press fit or friction fit, is a fastening between two parts which is achieved by friction after the parts are pushed together, rather than by any other means of fastening.

As indicated above, the light guide element is especially configured between the elongated body and the optical element, optionally as extension of one or both, or (thus) as separate body. Especially, the light guide element is elongated. In embodiments, the light guide element may have a length (L1) selected from the range of 0.5-20 mm.

Further, especially, the elongated luminescent body has a body axis (BA), wherein the light guide element has a body axis (BA1), wherein the body axes (BA,BA1) are collinear. In embodiment, the elongated luminescent body and the light guide element have the same cross-sectional symmetry (especially at least where the elongated body changes into the light guide element).

In yet further specific embodiments, the elongated luminescent body and the light guide element have the same cross-sectional shape (thus including essentially the same circumferential length) (especially at least where the elongated body changes into the light guide element).

In embodiments, the height of the elongated body is especially in the range from 0.2 to 5 mm. The width of the elongated body is especially in the range from 0.2 to 5 mm. The ratio of the height and width may be in the range from 0.4 to 2.5. The length of the elongated body may be in the range from 10 to 200 mm.

The length of the light guide (or extension of the optical element) is especially in the range from 1 to 20 mm. More especially, the length of the light guide (or extension of the optical element) is in the range from 3 to 15 mm. Most especially, the length of the light guide (or extension of the optical element) is in the range from 4 to 10 mm.

The width and/or height of the light guide is especially essentially identical to the width and/or height of the elongated body. Hence, in embodiments, the height of the light guide is especially in the range from 0.2 to 5 mm. The width of the light guide is especially in the range from 0.2 to 5 mm. The ratio of the height and width may be in the range from 0.4 to 2.5.

Yet, in embodiments the elongated luminescent body has a body axis, the light guide element has a body axis, and the optical element has a body axis, and two or more of these body axes are collinear.

Likewise, in embodiments the elongated luminescent body has an optical axis, the light guide element has an optical axis, and the optical element has an optical axis, and two or more of these optical axes are collinear.

As indicated above, the light source(s) may be configured to provide light source light to an (elongated) edge face. Hence, in embodiments the lighting device may especially comprising a plurality of light sources, wherein one or more of the plurality of light sources are configured to provide the light source light to the radiation input face, wherein the radiation input face is configured parallel to a body axis (BA) of the elongated luminescent body. However, especially no light sources are configured to provide light source light directly to the light guide element. Especially, the light guide element may receive luminescent material light, and optionally also light source light, essentially only via the elongated luminescent body (see also above).

The lighting device may be configured to provide white light or colored light. When there more than one light sources, and one or more light sources have substantially different spectral power distributions, then the lighting device may also color tunable. Hence, in embodiments the lighting device may also include or may be functionally coupled with a control system.

Therefore, in embodiments the first luminescent material is configured to provide one or more of green and yellow luminescent material light, wherein the second luminescent material is configured to provide red second luminescent material light, and wherein the lighting device is configured to provide white lighting device light.

In embodiments, the lighting device may thus be configured to provide colored light in a controlling mode and/or may be configured to provide white light in a controlling mode.

As indicated herein, the lighting device (or system) may execute an action in a mode. The term "mode" may also be indicated as "controlling mode". This does not exclude that the lighting device (or system) may also be adapted for providing another controlling mode, or a plurality of other controlling modes (such as a controlling mode for white light and a controlling mode for colored light, or controlling modes for white light with different color temperatures). However, the control system is adapted to provide at least a controlling mode. Would other modes be available, the choice of such modes may especially be executed via a user interface, though other options, like executing a mode in dependence of a sensor signal or a (time) scheme may also be possible.

In embodiments, the lighting device is configured to provide lighting device light without light source light that of the light source(s) that are configured to excite the first luminescent material. This may be achieved with configuring the(se) light source(s) with their optical axes essentially parallel to a radiation exit window of the elongated body (or of the light guide element), and or by using a relative high concentration of the first luminescent material, and/or by using a relatively long elongated element, and/or by using an optical filter. By choosing these parameters a full conversion of the light source light (for exciting the first luminescent material) may be achieved or a partial conversion of the light source light (for exciting the first luminescent material) may be achieved.

Hence, would the lighting device light include blue light, this may be of the light source, and/or this may be of the first luminescent material, and/or this may be by providing an additional light source for providing blue light, which may e.g. provide its blue light directly to the light guide element and/or optical element, especially essentially only to the light guide element (for mixing with the other light).

Yet further, some other specific embodiments are described below.

In specific embodiments, the body may include a part where no or a reduced content of luminescent material (or activator) is available. Such part may e.g. be used for mixing of the light generated upstream in the (same) body. In both embodiments, the body includes a radiation exit window. Hence, in such embodiments, the luminescent element exit window may comprise or be the radiation exit window. In other embodiments, the luminescent body may be optically coupled with an optical extension element, such as a mixing element. Especially, this element has a refractive index close to that of the luminescent body, such as an index of refraction in the range of +/−10%, such as +/−5%, like +/−2% of the index of refraction of the luminescent body.

The index of refraction of interest may especially be the refractive index at the wavelength of interest, which may be defined as the emission maximum of the first luminescent material or alternatively as the centroid wavelength of the emission of the first luminescent material.

The term "centroid wavelength", is known in the art, and refers to the wavelength value where half of the light energy is at shorter and half the energy is at longer wavelengths; the value is stated in nanometers (nm). It is a spectral average of the intensity over the wavelength ($\Sigma\lambda*I_\lambda/(\Sigma I)$; i.e. the integration of the intensity over the emission band normalized to the integrated intensity). The emission maximum or the centroid wavelength may be determined at room temperature (especially 20° C.) of the respective luminescent material.

The term "face" may thus refer to a side of the body. Hence, the term "window" may refer to the face from which radiation may escape from the body or luminescent element and/or where radiation enters into the body. Therefore, especially each luminescent element has a luminescent element exit window for escape of the first luminescent material light from the luminescent element. As the body is an elongated body, the radiation input face is especially an elongated face. The radiation input face may thus be (comprised by) a side face of the elongated body. The luminescent element exit window may especially be configured for coupling of at least part of the first luminescent material light out of the element, such as of the elongated luminescent body, via the luminescent element exit window (such as via the radiation exit window of the elongated body). As indicated elsewhere, in general the area of the radiation input face(s) is larger than the area of the luminescent exit window (such as the radiation exit window of the body). Especially, a ratio A:E is >2:1, such as >2:1 and <50000:1, where A and E are defined as follows the areas of the radiation input face and the radiation exit window, respectively.

Hence, the device may include a luminescent body with a mixing element (i.e. light mixing element), which is especially optically coupled with the luminescent body. Luminescent material light may propagate from the luminescent body into the mixing element, and escape from the mixing element. In such embodiments, the first luminescent material light may emanate from a radiation exit window of the optical extension element. Hence, in such embodiments, the luminescent element exit window may comprise or be the radiation exit window of the optical extension element. Here, the term "optical extension element" may especially refer to a mixing element and/or an element to correct for e.g. the tapered configuration (see also below) of the bodies, which, by such correction may lead to a configuration wherein the luminescent element exit windows are configured in a plane.

In embodiments, the lighting device may further comprise one or more heat sinks. The one or more cooling elements may be in thermal contact with the luminescent concentrator. The cooling element can be a heatsink or an actively cooled element, such as a Peltier element. Further, the cooling element can be in thermal contact with the light transmissive body via other means, including heat transfer via air or with an intermediate element that can transfer heat, such as a thermal grease. Especially, however, the cooling element is essentially not in physical contact with the light transmissive body. The term "cooling element" may also refer to a plurality of (different) cooling elements. In embodiments the cooling element may have an average distance to the elongated light transmissive body of at least 1 µm, such as at least 2 µm, like especially at least 5 µm, or wherein the heat dissipating element is in physical contact with at maximum 10%, such as at maximum 5% of a total area of the side face(s) of the elongated light transmissive body. The average is thus especially not larger than 50 µm.

Hence, the lighting device may include a heatsink configured to facilitate cooling of the solid-state light source and/or luminescent concentrator. The heatsink may comprise or consist of copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. Alternatively or additionally, the heatsink may comprise or consist of aluminum oxide. The term "heatsink" may also refer to a plurality of (different) heatsink. The cooling element or heatsink may be used to cool the light transmissive body and/or the same or different cooling element or heatsink may be used to cool the light source(s). The cooling elements or heatsinks may also provide interfaces to further cooling means or allow cooling transport to dissipate the heat to the ambient. For instance, the cooling elements or heatsinks may be connected to heat pipes or as water cooling systems that are connect to more remotely placed heatsinks or may be directly cooled by air flows such as generated by fans. Both passive and active cooling may be applied. A heat sink can be defined as a passive heat exchanger that transfers the heat generated by e.g. an electronic or a mechanical device to a fluid medium, often air or a liquid coolant, whereby the heat can be dissipated away from the device. This allows regulation of the device's temperature.

In specific embodiments, there is no physical contact between the heat sink (or cooling element) and the light transmissive body. Especially, the average is at least the intensity averaged wavelength of light that is transmitted by luminescence of luminescent material. In embodiments, the average between the light transmissive body and the heatsink or cooling element is at least 1 µm, such as at least 2 µm, like at least 5 µm. Further, for a good heat transfer the average distance between the light transmissive body and the heatsink or cooling elements is not larger than 50 µm, such as not larger than 25 µm, like not larger than 20 µm, such as equal to or smaller than 15 µm, like at maximum 10 µm.

Therefore, in embodiments the lighting device may further comprise a heat sink having an average distance to the elongated light transmissive body of at least 1 µm, such as at least 2 µm, like especially at least 5 µm, or wherein the heat dissipating element is in physical contact with at maximum 10%, such as at maximum 5% of a total area of the side face(s) of the elongated light transmissive body. The average is thus especially not larger than 50 µm. The term cooling element may refer to a heat sink or an active cooling element.

In particular embodiments, the elongated luminescent concentrator is clamped between 2 metal plates or clamped within a housing consisting of a highly thermal conductive material such way that a sufficient air gap between the elongated luminescent concentrator remains present to provide TIR (total internal reflection) of the light trapped within the elongated luminescent concentrator while a sufficient amount of heat may traverse from the elongated luminescent concentrator through the air gap towards the highly thermal conductive housing. The thickness of the air gap is higher than the wavelength of the light, e.g. higher than 0.1 µm, e.g. higher 0.5 µm. The elongated luminescent concentrator is secured in the housing by providing small particles between the elongated luminescent concentrator and the housing, such as small spheres or rods having a diameter higher than 0.1 µm, e.g. higher 0.5 µm, like at least 1 µm, such as at least 5 µm, especially equal to or smaller than 20 µm, such as equal to or smaller than 10 µm (see also above defined average). Alternatively, the elongated luminescent concentrator may be secured in the housing by providing some surface roughness on the surfaces of the highly thermal conductive housing touching the elongated luminescent concentrator, the surface roughness varying over a depth higher than 0.1 μm, e.g. higher 0.5 μm, especially equal to or smaller than about 10 μm.

The density of such spheres, rods or touch points of a rough surface of the highly thermal conductive housing is relatively very small, such that most of the surface area of the elongated light transmissive body remains untouched securing a high level of TIR reflections within of the light trapped within the elongated light transmissive body, like at maximum 10%, such as at maximum 5% of a total area of the side face(s) of the elongated light transmissive body.

As indicated above, there may be optical contact between two elements (having an optional functionality). The term "optical contact" and similar terms, such as "optically coupled" may especially mean that light escaping from a radiation exit window may enter a radiation entrance window with minimal losses (such as Fresnel reflection losses or TIR (total internal reflection) losses) due to refractive index differences of these elements. The losses may be minimized by one or more of the following elements: a direct optical contact between the two optical elements, providing an optical glue between the two optical elements, especially the optical glue having a refractive index higher that the lowest refractive index of the two individual optical elements, providing the two optical elements in close vicinity (e.g. at a distance much smaller than the wavelength of the light), such that the light will tunnel through the material present between the two optical elements, providing an optically transparent interface material between the two optical elements, especially the optically transparent interface material having a refractive index higher that the lowest refractive index of the two individual optical elements, the optically transparent interface material might be a liquid or a gel or providing optical Anti Reflection coatings on the surfaces of (one or both of) the two individual optical elements. In embodiments, the optically transparent interface material may also be a solid material. Further, the optical interface material or glue especially may have a refractive index not higher than the highest refractive index of the two individual optical elements.

Instead of the term "in optical contact", and similar terms, also the terms "radiationally coupled" or "radiatively coupled" or "optically coupled" may be used. The term "radiationally coupled" especially means that elements are associated with each other so that at least part of the radiation emitted by one element is received by the other element. For instance, this may apply for the elongated body and the light guide element, and for the light guide element and the optical element, respectively.

Especially the indicated "windows" may in embodiments be in physical contact with each other or may in other embodiments be separated from each other with a (thin) layer of optical glue, e.g. having a thickness of less than about 1 mm, especially less than 100 μm. When no optically transparent interface material is applied, the distance between two elements being in optical contact may especially be about at maximum the wavelength of relevance, such as the wavelength of an emission maximum. For visible wavelengths, this may be less than 1 μm, such as less than 0.7 μm, and for blue even smaller.

As indicated above, the lighting device may comprise a plurality of light sources to provide light source light that is at least partly converted by the light transmissive body, more especially the first luminescent material of the light transmissive body, into converter radiation. The converted light can at least partially escape form the radiation exit window, which is especially in optical contact with the optical element, more especially the radiation entrance window thereof.

Likewise, the light sources are radiationally coupled with the luminescent body, though in general the light sources are not in physical contact with the luminescent body (see also below). As the luminescent body is a body and as in general also the optical element is a body, the term "window" herein may especially refer to side or a part of a side.

Hence, the luminescent body comprises one or more side faces, wherein the optical element is configured to receive at the radiation entrance window at least part of the converter radiation that escapes from the one or more side faces.

This radiation may reach the entrance window via a gas, such as air directly. Additionally or alternatively, this radiation may reach the entrance window after one or more reflections, such as reflections at a mirror positioned nearby the luminescent body. Hence, in embodiments the lighting device may further comprise a first reflective surface, especially configured parallel to one or more side faces, and configured at a first distance from the luminescent body, wherein the first reflective surface is configured to reflect at least part of the converter radiation that escapes from the one or more side faces back into the luminescent body or to the optical element. The space between the reflective surface and the one or more side faces comprises a gas, wherein the gas comprises air. The first distance may e.g. be in the range of 0.1 μm-20 mm, such as in the range of 1 μm-10 mm, like 2 μm-10 mm.

Especially, the distance is at least wavelength of interest, more especially at least twice the wavelength of interest. Further, as there may be some contact, e.g. for holding purposes or for distance holder purposes, especially an average distance is at least $\lambda_i$, such as at least $1.5*\lambda_i$, like at least $2*\lambda_i$ such as especially about $5*\lambda_i$, wherein $\lambda_i$ is the wavelength of interest (see also above). Especially, however, the average distance is in embodiments not larger than 50 μm, such as not larger than 25 μm, like not larger than 20 μm, like not larger than 10 μm, for purposes of good thermal contact. Likewise, such average minimum distance may apply to a reflector and/or optical filter configured at e.g. an end face, or other optical components as well. Optionally, in embodiments an element may comprise both heat sinking function a reflection function, such as a heat sink with a reflective surface, or a reflector functionally coupled to a heat sink.

The lighting device may be configured to provide blue, green, yellow, orange, or red light, etc. Alternatively or additionally, in embodiments, the lighting device may (also) be configured to provide one or more of UV, such as near UV (especially in the range of 320-400 nm), and IR, such as near IR (especially in the range of 750-3000 nm). Further, in specific embodiment, the lighting device may be configured to provide white light. If desired, monochromaticity may be improved using optical filter(s). The definitions of near UV and near infrared may partly overlap with the generally used definition for visible light, which is 380-780 nm.

The term "light concentrator" or "luminescent concentrator" is herein used, as one or more light sources irradiate a relative large surface (area) of the light converter, and a lot of converter radiation may escape from a relatively small area (exit window) of the light converter. Thereby, the specific configuration of the light converter provides its light concentrator properties. Especially, the light concentrator may provide Stokes-shifted light, which is Stokes shifted relative to the pump radiation. Hence, the term "luminescent concentrator" or "luminescent element" may refer to the same element, especially an elongated light transmissive body (comprising a luminescent material), wherein the term "concentrator" and similar terms may refer to the use in combination with one or more light sources and the term "element" may be used in combination with one or more, including a plurality, of light sources. When using a single light source, such light source may e.g. be a laser, especially a solid-state laser (like a LED laser). The elongated light transmissive body comprises a first luminescent material and can herein especially be used as luminescent concentrator. The elongated light transmissive body is herein also indicated as "luminescent body". Especially, a plurality of light sources may be applied.

The terms "upstream" and "downstream" relate to an arrangement of items or features relative to the propagation of the light from a light generating means (here the especially the light source(s)), wherein relative to a first position within a beam of light from the light generating means, a second position in the beam of light closer to the light generating means is "upstream", and a third position within the beam of light further away from the light generating means is "downstream".

The light concentrator comprises a light transmissive body. The light concentrator is especially described in relation to an elongated light transmissive body, such as a ceramic rod or a crystal, such as a single crystal, or a polymeric body. However, these aspects may also be relevant for other shaped ceramic bodies or single crystals. In specific embodiments, the luminescent body comprises a ceramic body or single crystal.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more luminescence wavelengths may be at least 80%/cm, such as at least 90%/cm, even more especially at least 95%/cm, such as at least 98%/cm, such as at least 99%/cm. This implies that e.g. a 1 cm³ cubic shaped piece of light transmissive body, under perpendicular irradiation of radiation having a selected luminescence wavelength (such as a wavelength corresponding to an emission maximum of the luminescence of the first luminescent material of the light transmissive body), will have a transmission of at least 95%.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein disregard Fresnel losses.

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission (intensity) of the luminescence of the first luminescent material. The term "mean free path" is especially the average distance a ray will travel before experiencing a scattering event that will change its propagation direction.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

Herein, the term "visible light" especially relates to light having a wavelength selected from the range of 380-780 nm. The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The light transmissive body may have any shape, such as beam (or bar) like or rod like, however especially beam like (cuboid like). However, the light transmissive body may also be disk like, etc. The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face.

Especially, in embodiments the solid-state light source, or other light source, is not in (direct) physical contact with the light transmissive body.

Physical contact (between the light exit window(s) of the light source(s) and the light entrance window(s) of the light transmissive body/bodies) may lead to undesired outcoupling (from the light transmissive body) and thus a reduction in concentrator efficiency. Hence, especially there is substantially no physical contact. If the actual contact area is kept small enough, the optical impact may be negligible or at least acceptable. Therefore, it may be perfectly acceptable to have some physical contact, e.g. by some small points as resulting from a certain surface roughness, or non-perfectly flat surface, or by some intentionally created "highest spots" on a surface that will define a certain average distance between the two surfaces that do not extract substantial amounts of light while enabling a short average distance.

Further, in general the light transmissive body comprises two substantially parallel faces, a radiation input face and opposite thereof the opposite face. These two faces define herein the width of the light transmissive body. In general, the length of these faces defines the length of the light transmissive body. Hence, in general these faces are elongated faces. However, as indicated above, and also below, the light transmissive body may have any shape, and may also include combinations of shapes. Especially, the radiation input face has a radiation input face area (A), wherein the radiation exit window has a radiation exit window area (E), and wherein the radiation input face area (A) is at least 1.5 times, even more especially at least two times larger than the radiation exit window area (E), especially at least 5 times larger, such as in the range of 2-50,000, especially 5-5,000 times larger. Hence, especially the elongated light transmissive body comprises a geometrical concentration factor, defined as the ratio of the area of the radiation input faces and the area of the radiation exit window, of at least 1.5, such as at least 2, like at least 5, or much larger (see above). This allows e.g. the use of a plurality of solid-state light sources (see also below). For typical applications like in automotive, digital projectors, or high brightness spot light applications, a small but high radiant flux or luminous flux emissive surface is desired. This cannot be obtained with a single LED, but can be obtained with the present lighting device. Especially, the radiation exit window has a radiation exit window area (E) selected from the range of 1-100 mm$^2$. With such dimensions, the emissive surface can be small, whereas nevertheless high radiance or luminance may be achieved. As indicated above, the light transmissive body in general has an aspect ratio (of length/width). This allows a small radiation exit surface, but a large radiation input surface, e.g. irradiated with a plurality of solid-state light sources. In a specific embodiment, the light transmissive body has a width (W) selected from the range of 0.5-100 mm, like especially up to 30 mm, such as 0.5-10 mm, like especially 0.5-5 mm. The light transmissive body is thus especially an integral body, having the herein indicated faces.

Especially, the radiation input face(s) and the radiation exit window have mutual angles ($\alpha$) larger than 0° and smaller than 180°, such as in embodiments 90°. In general, the former faces are side faces, and the latter window is (comprised by) an end face. However, the radiation exit window may thus also comprise a face that may be configured with an obtuse or acute angle relative to one or more of the (other) faces of the body.

The generally rod shaped or bar shaped light transmissive body can have any cross sectional shape, but in embodiments has a cross section the shape of a square, rectangle, round, oval, triangle, pentagon, or hexagon. Generally, the ceramic or crystal bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section. Hence, in embodiments the elongated light transmissive body further has a width (W) and a height (H), with especially L>W and L>H. Especially, the first face and the second face define the length, i.e. the distance between these faces is the length of the elongated light transmissive body. These faces may especially be arranged parallel. Further, in a specific embodiment the length (L) is at least 2 cm, like 3-20 cm, such as 4-20 cm, such as at maximum 15 cm. Other dimensions may, however, also be possible, such as e.g. 0.5-2 cm.

Especially, the light transmissive body has a width (W) selected to absorb more than 95% of the light source light. In embodiments, the light transmissive body has a width (W) selected from the range of 0.03-4 cm, especially 0.05-2 cm, such as 0.1-1.5 cm, like 0.1-1 cm. With the herein indicated cerium concentration, such width is enough to absorb substantially all light (especially at the excitation wavelength with maximum excitation intensity) generated by the light sources.

The light transmissive body may also be a cylindrically shaped rod. In embodiments the cylindrically shaped rod has one flattened surface along the longitudinal direction of the rod and at which the light sources may be positioned for efficient incoupling of light emitted by the light sources into the light transmissive body. The flattened surface may also be used for placing heatsinks. The cylindrical light transmissive body may also have two flattened surfaces, for example located opposite to each other or positioned perpendicular to each other. In embodiments, the flattened surface extends along a part of the longitudinal direction of the cylindrical rod. Especially however, the edges are planar and configured perpendicular to each other.

The side face is especially such flattened surface(s). The flattened surface especially has a relatively low surface roughness, such as a Ra of at maximum 100 nm, such as in the range of 5-100 nm, like up to 50 nm.

The light transmissive body may also be a fiber or a multitude of fibers, for instance a fiber bundle, either closely spaced or optically connected in a transparent material. The fiber may be referred to as a luminescent fiber. The individual fiber may be very thin in diameter, for instance, 0.1 to 0.5 mm. The light transmissive body may also comprise a tube or a plurality of tubes. In embodiments, the tube (or tubes) may be filled with a gas, like air or another gas having higher heat conductivity, such as helium or hydrogen, or a gas comprising two or more of helium, hydrogen, nitrogen, oxygen and carbon dioxide. In embodiments, the tube (or tubes) may be filled with a liquid, such as water or (another) cooling liquid.

The light transmissive body as set forth below in embodiments according to the invention may also be folded, bended and/or shaped in the length direction such that the light transmissive body is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact light transmissive body of which the total length, along which generally the light is guided, is relatively large, leading to a relatively high lumen output, but can at the same time be arranged into a relatively small space. For example, luminescent parts of the light transmissive body may be rigid while transparent parts of the light transmissive body are flexible to provide for the shaping of the light transmissive body along its length direction. The light sources may be placed anywhere along the length of the folded, bended and/or shaped light transmissive body.

Parts of the light transmissive body that are not used as light incoupling area or light exit window may be provided with a reflector. Hence, in an embodiment the lighting device further comprises a reflector configured to reflect luminescent material radiation back into the light transmissive body. Therefore, the lighting device may further include one or more reflectors, especially configured to reflect radiation back into the light transmissive body that escapes from one or more other faces than the radiation exit window. Especially, a face opposite of the radiation exit window may include such reflector, though in an embodiment not in physical contact therewith. Hence, the reflectors may especially not be in physical contact with the light transmissive body. Therefore, in an embodiment the lighting device further comprises an optical reflector (at least) configured downstream of the first face and configured to reflect light back into the elongated light transmissive body. Alternatively or additionally, optical reflectors may also be arranged at other faces and/or parts of faces that are not used to couple light source light in or luminescence light out. Especially, such optical reflectors may not be in physical contact with the light transmissive body. Further, such optical reflector(s) may be configured to reflect one or more of the luminescence and light source light back into the light transmissive body. Hence, substantially all light source light may be reserved for conversion by the first luminescent material (i.e. the activator element(s) such as especially $Ce^{3+}$) and a substantial part of the luminescence may be reserved for outcoupling from the radiation exit window. The term "reflector" may also refer to a plurality of reflectors.

The one or more reflectors may consist of a metal reflector, such as a thin metal plate or a reflective metal layer deposited on a substrate, such as e.g. glass. The one or more reflectors may consist of an optical transparent body containing optical structure to reflect (part) of the light such as prismatic structures. The one or more reflectors may consist of specular reflectors. The one or more reflectors may contain microstructures, such as prism structures or saw tooth structures, designed to reflect the light rays towards a desired direction.

Especially, such reflectors are also present in the plane where the light sources are positioned, such that that plane consist of a mirror having openings, each opening having the same size as a corresponding light source allowing the light of that corresponding light source to pass the mirror layer and enter the elongated (first) light transmissive body while light that traverses from the (first) light transmissive body in the direction of that plane receives a high probability to hit the mirror layer and will be reflected by that mirror layer back towards the (first) light transmissive body.

The terms "coupling in" and similar terms and "coupling out" and similar terms indicate that light changes from medium (external from the light transmissive body into the light transmissive body, and vice versa, respectively). In general, the light exit window will be a face (or a part of a face), configured (substantially) perpendicular to one or more other faces of the waveguide. In general, the light transmissive body will include one or more body axes (such as a length axis, a width axis or a height axis), with the exit window being configured (substantially) perpendicular to such axis. Hence, in general, the light input face(s) will be configured (substantially) perpendicular to the light exit window. Thus, the radiation exit window is especially configured perpendicular to the one or more radiation input faces. Therefore, especially the face comprising the light exit window does not comprise a light input face.

For further improving efficiency and/or for improving the spectral power distribution several optical elements may be included like mirrors, optical filters, additional optics, etc.

In specific embodiments, the lighting device may have a mirror configured at the first face configured to reflect light back into the elongated light transmissive body, and/or may have one or more of an optical filter, a (wavelength selective) mirror, a reflective polarizer, light extraction structures, and a collimator configured at the second face. At the second face the mirror may e.g. be a wavelength selective mirror or a mirror including a hole. In the latter embodiment, light may be reflected back into the body but part of the light may escape via the hole. Especially, in embodiments the optical element may be configured at a distance of about 0.01-1 mm, such as 0.1-1 mm from the body. This may especially apply for e.g. mirrors, wherein optical coupling is not desired.

When optical coupling is desired, such as with an optical element, like a CPC or a mixing element, downstream of the (part of the) body where the first luminescent material is located, an optically transparent interface material may be applied. In yet other embodiments, when no optically transparent interface material is applied, the average distance between two elements being in optical contact may especially be about at maximum the wavelength of relevance, such as the wavelength of an emission maximum (of the first luminescent material). Hence, when optical contact is desired, there may be physical contact. Even in such embodiments, there may be a non-zero average distance, but then equal to or lower than the wavelength of interest.

In specific embodiments, especially when no optical contact is desired, the average distance may be as indicated above but at a few places, for instance for configuration purposes, there may be physical contact. For instance, there may be contact with the edge faces over less than 10%, such as over less than 5% of the total area of the side faces. Hence, the minimum average distance may be as defined e.g. above and if there is physical contact, this physical contact may be with at maximum 10% of the surface area of the surface with which the element (mirror and/or heat sink) is in physical contact, such as at maximum 5%, like at maximum 2%, even more especially at maximum 1%. For instance, for the side faces an average distance may e.g. be between ca 2 and 10 µm (the lower limit basically determined as being a few times the wavelength of interest; here, assuming e.g. visible light). This may be achieved by having physical contact (to secure that distance) over less than 1% of the total area of that respective side face.

For instance, a heat sink or a reflector, or the relevant surface may have some protrusions, like a surface roughness, by which there may be contact between the surface and the element, but in average the distance is at least (or more, see also above)(in order to essentially prevent optical contact), but there is physical contact with equal to or less than 10% of the surface of the body (to which the element may be thermally coupled and/or optically not coupled), especially substantially less.

In embodiments, optical elements may be included at one or more of the side faces. In particular, anti-reflection coatings may be applied to enhance coupling efficiency of the (excitation) light source light and/or (wavelength selective) reflection coatings for the converted light.

Downstream of the luminescent element exit window, such as the radiation exit window, optionally an optical filter may be arranged. Such optical filter may be used to remove undesired radiation. For instance, when the lighting device should provide red light, all light other than red may be removed. Hence, in a further embodiment the lighting device further comprises an optical filter configured downstream of the (radiation) exit window and configured to reduce the relative contribution of undesired light in the converter radiation (downstream of the radiation exit window). For filtering out light source light, optionally an interference filter may be applied.

In yet a further embodiment, the lighting device further comprises a collimator configured downstream of the luminescent element exit window, such as the radiation exit window and configured to collimate the converter radiation. Such collimator, like e.g. a CPC (compound parabolic concentrator), may be used to collimate the light escaping from the radiation exit window and to provide a collimated or pre-collimated beam of light. Herein, the terms "collimated", "precollimated" and similar terms may especially refer to a light beam having a solid angle (substantially) smaller than $2\pi$.

As indicated above, the lighting device may comprise a plurality of light sources. This plurality of light sources may be configured to provide light source light to a single side or face or to a plurality of faces; see further also below. When providing light to a plurality of faces, in general each face will receive light of a plurality of light sources (a subset of the plurality of light sources). Hence, in embodiments a plurality of light sources will be configured to provide light source light to a radiation input face. Also, this plurality of light sources will in general be configured in a row or a plurality of rows. Hence, the light transmissive body is elongated, the plurality of light sources may be configured in a row, which may be substantially parallel to the axis of elongated of the light transmissive body. The row of light sources may have substantially the same length as the elongated light transmissive body. Hence, in the light transmissive body has a length (L) in the range of about 80-120% of the second length (L2) of the row of light sources; or the row of light sources has a length in the range of about 80-120% of the length of the light transmissive body.

The light sources may be configured to provide light with a wavelength selected from the range of UV (including near UV), visible, and infrared (including near IR).

Especially, the light sources are light sources that during operation emit (light source light) at least light at a wavelength selected from the range of 200-490 nm, especially light sources that during operation emit at least light at wavelength selected from the range of 360-490 nm, such as 400-490 nm, even more especially in the range of 430-490 nm, such as 440-490 nm, such as at maximum 480 nm. This light may partially be used by the first luminescent material. Hence, in a specific embodiment, the light source is configured to generate blue light. Alternatively or additionally, the light source may be configured to generate UV radiation.

In a specific embodiment, the light source comprises a solid-state light source (such as a LED or laser diode). The term "light source" may also relate to a plurality of light sources, such as e.g. 2-2000, such as 2-500, like 2-100, e.g. at least 4 light sources, such as in embodiments especially 4-80 (solid-state) light sources, though many more light sources may be applied. Hence, in embodiments 4-500 light sources may be applied, like e.g. 8-200 light sources, such as at least 10 light sources, or even at least 50 light sources. The term "light source" may also relate to one or more light sources that are tailored to be applied for such light concentrating luminescent concentrators, e.g. one or more LED's having a long elongated radiating surface matching the long elongated light input surfaces of the elongated luminescent concentrator. Hence, the term LED may also refer to a plurality of LEDs. Hence, as indicated herein, the term "solid-state light source" may also refer to a plurality of solid-state light sources. In an embodiment (see also below), these are substantially identical solid-state light sources, i.e. providing substantially identical spectral power distributions of the solid-state light source radiation. In embodiments, the solid-state light sources may be configured to irradiate different faces of the light transmissive body. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB ("printed circuit board") or comparable. Hence, a plurality of semiconductor light sources may be configured on the same substrate. In embodiments, a COB is a multi LED chip configured together as a single lighting module.

The lighting device comprises a plurality of light sources. Especially, the light source light of the plurality (m) of light sources have spectral overlap, even more especially, they are of the same type and provide substantial identical light (having thus substantial the same spectral power distribution). Hence, the light sources may substantially have the same emission maximum ("peak maximum"), such as within a bandwidth of 10 nm, especially within 8 nm, such as within 5 nm (e.g. obtained by binning) However, in yet other embodiments, the lighting device may comprise a single light source, especially a solid-state light source having a relatively large die. Hence, herein also the phrase "one or more light sources" may be applied. As indicated above, they may be in the same bin, though optionally this may differ for two or more sets.

In embodiments, there may be two or more different luminescent materials, such as e.g. when applying two or more different light transmissive bodies. In such embodiments, the light sources may comprise light sources with two or more different emission spectra enabling excitation of two different luminescent materials. Such two or more different light sources may belong to different bins.

The light sources are especially configured to provide a blue optical power ($W_{opt}$) of at least 0.2 Watt/mm$^2$ to the light transmissive body, i.e. to the radiation input face(s). The blue optical power is defined as the energy that is within the energy range that is defined as blue part of the spectrum (see also below). Especially, the photon flux is in average at least $4.5*10^{17}$ photons/(s·mm$^2$), such as at least $6.0*10^{17}$ photons/(s·mm$^2$). Assuming blue (excitation) light, this may e.g. correspond to a blue power ($W_{opt}$) provided to at least one of the radiation input faces of in average at least 0.067 Watt/mm$^2$ and 0.2 Watt/mm$^2$, respectively. Here, the term "in average" especially indicates an average over the area (of the at least one of the radiation input surfaces). When more than one radiation input surface is irradiated, then especially each of these radiation input surfaces receives such photon flux. Further, especially the indicated photon flux (or blue power when blue light source light is applied) is also an average over time.

In yet a further embodiment, especially for (DLP (digital light processing)) projector applications, the plurality of light sources are operated in pulsed operation with a duty cycle selected from the range of 10-80%, such as 25-70%.

In yet a further embodiment, especially for (LCD or DLP) projector applications using dynamic contrast technologies, such as e.g. described in WO0119092 or USRE42428 (E1), the plurality of light sources are operated in video signal content controlled PWM pulsed operation with a duty cycle selected from the range of 0.01-80%, such as 0.1-70%.

In yet a further embodiment, especially for (LCD or DLP) projector applications using dynamic contrast technologies, such as e.g. described in US patent WO0119092 or U.S. Pat. No. 6,631,995 (B2), the plurality of light sources are operated in video signal content controlled intensity modulated operation with intensity variations selected from the range of 0.1-100%, such as 2-100%.

The lighting device may comprise a plurality of luminescent concentrators, such as in the range of 2-50, like 2-20 light concentrators (which may e.g. be stacked).

The light concentrator may radiationally be coupled with one or more light sources, especially a plurality of light sources, such as 2-1000, like 2-50 light sources. The term "radiationally coupled" especially means that the light source and the light concentrator are associated with each other so that at least part of the radiation emitted by the light source is received by the light concentrator (and at least partly converted into luminescence). Instead of the term "luminescence" also the terms "emission" or "emission radiation" may be applied.

Hence, the luminescent concentrator receives at one or more radiation input faces radiation (pump radiation) from an upstream configured light concentrator or from upstream configured light sources. Further, the light concentrator comprises a first luminescent material configured to convert at least part of a pump radiation received at one or more radiation input faces into luminescent material radiation, and the luminescent concentrator configured to couple at least part of the first luminescent material radiation out at the radiation exit window as converter radiation. This converter radiation is especially used as component of the lighting device light.

The phrase "configured to provide luminescent material radiation at the radiation exit window" and similar phrases especially refers to embodiments wherein the first luminescent material radiation is generated within the luminescent concentrator (i.e. within the light transmissive body), and part of the first luminescent material radiation will reach the radiation exit window and escape from the luminescent concentrator. Hence, downstream of the radiation exit window the first luminescent material radiation is provided. The converter radiation, downstream of the radiation exit window comprises at least the first luminescent material radiation escaped via the radiation exit window from the light converter. Instead of the term "converter radiation" also the term "light concentrator light" may be used. Pump radiation can be applied to a single radiation input face or a plurality of radiation input faces.

In embodiments, the length (L) is selected from the range of 1-100 cm, such as especially 2-50 cm, like at least 3 cm, such as 5-50 cm, like at maximum 30 cm.

In yet further embodiments, the elongated light transmissive body (of the luminescent concentrator) comprises an elongated ceramic body. For instance, luminescent ceramic garnets doped with $Ce^{3+}$ (trivalent cerium) can be used to convert blue light into light with a longer wavelength, e.g. within the green to red wavelength region, such as in the range of about 500-750 nm, or even in the cyan. To obtain sufficient absorption and light output in desired directions, it is advantageous to use transparent rods (especially substantially shaped as beams). Such rod can be used as light concentrator, converting light source light into converter radiation and providing at an exit surface (a substantial amount of) (concentrated) converter radiation. Lighting devices based on light concentrators may e.g. be of interest for projector applications. For projectors, red, yellow, green and blue luminescent concentrators are of interest. Green and/or yellow luminescent rods, based on garnets, can be relatively efficient. Such concentrators are especially based on YAG:Ce (i.e. $Y_3Al_5O_{12}:Ce^{3+}$) or LuAG, which can be indicated as $(Y_{1-x}Lu_x)_3Al_5O_{12}:Ce^{3+}$, where $0 \le x \le 1$, such as in embodiments $Lu_3Al_5O_{12}:Ce^{3+}$. 'Red' garnets can be made by doping a YAG-garnet with Gd ("YGdAG"). Cyan emitters can be made by e.g. replacing (part of the) Al (in e.g. LuAG) by Ga (to provide "LuGaAG"). Blue luminescent concentrators can be based on YSO ($Y_2SiO_5:Ce^{3+}$) or similar compounds or BAM ($BaMgAl_{10}O_{17}:Eu^{2+}$) or similar compounds, especially configured as single crystal(s). The term similar compounds especially refer to compounds having the same crystallographic structure but where one or more cations are at least partially replaced with another cation (e.g. Y replacing with Lu and/or Gd, or Ba replacing with Sr). Optionally, also anions may be at least partially replaced, or cation-anion combinations, such as replacing at least part of the Al—O with Si—N.

Hence, especially the elongated light transmissive body comprises a ceramic material configured to wavelength convert at least part of the (blue) light source light into converter radiation in e.g. one or more of the green, yellow and red, which converter radiation at least partly escapes from the radiation exit window.

In embodiments, the ceramic material especially comprises an $A_3B_5O_{12}:Ce^{3+}$ ceramic material ("ceramic garnet"), wherein A comprises yttrium (Y) and/or lutetium (Lu) and/or gadolinium (Gd), and wherein B comprises aluminum (Al) and/or gallium (Ga), especially at least Al. As further indicated below, A may also refer to other rare earth elements and B may include Al only, but may optionally also include gallium. The formula $A_3B_5O_{12}:Ce^{3+}$ especially indicates the chemical formula, i.e. the stoichiometry of the different type of elements A, B and O (3:5:12). However, as known in the art the compounds indicated by such formula may optionally also include a small deviation from stoichiometry.

In yet a further aspect, the invention also provides such elongated light transmissive body per se, i.e. an elongated light transmissive body having a first face and a second face, these faces especially defining the length (L) of the elongated light transmissive body, the elongated light transmissive body comprising one or more radiation input faces and a radiation exit window, wherein the second face comprises the radiation exit window, wherein the elongated light transmissive body comprises a ceramic material configured to wavelength convert at least part of (blue) light source light into converter radiation, such as (at least) one or more of green, yellow, and red converter radiation (which at least partly escapes from the radiation exit window when the elongated light transmissive body is irradiated with blue light source light), wherein the ceramic material comprises an $A_3B_5O_{12}:Ce^{3+}$ ceramic material as defined herein. Such light transmissive body can thus be used as light converter. Especially, such light transmissive body has the shape of a cuboid.

As indicated above, in embodiments the ceramic material comprises a garnet material. However, also other (crystallographic) cubic systems may be applied. Hence, the elongated body especially comprises a luminescent ceramic. The garnet material, especially the ceramic garnet material, is herein also indicated as "luminescent material". The first luminescent material comprises an $A_3B_5O_{12}:Ce^{3+}$ (garnet material), wherein A is especially selected from the group consisting of Sc, Y, Tb, Gd, and Lu (especially at least Y and/or Lu, and optionally Gd), wherein B is especially selected from the group consisting of Al and Ga (especially at least Al). More especially, A (essentially) comprises (i) lutetium (Lu), (ii) yttrium, (iii) yttrium (Y) and lutetium (Lu), (iv) gadolinium (Gd), optionally in combination with one of the aforementioned, and B comprises aluminum (Al) or gallium (Ga) or a combination of both. Such garnet is be doped with cerium (Ce), and optionally with other luminescent species such as praseodymium (Pr).

As indicated above, the element A may especially be selected from the group consisting of yttrium (Y) and gadolinium (Gd). Hence, $A_3B_5O_{12}:Ce^{3+}$ especially refers to $(Y_{1-x}Gd_x)_3B_5O_{12}:Ce^{3+}$, wherein especially x is in the range of 0.1-0.5, even more especially in the range of 0.2-0.4, yet even more especially 0.2-0.35. Hence, A may comprise in the range of 50-90 atom % Y, even more especially at least 60-80 atom % Y, yet even more especially 65-80 atom % of A comprises Y. Further, A comprises thus especially at least 10 atom % Gd, such as in the range of 10-50 atom % Gd, like 20-40 atom %, yet even more especially 20-35 atom % Gd.

Especially, B comprises aluminum (Al), however, B may also partly comprise gallium (Ga) and/or scandium (Sc) and/or indium (In), especially up to about 20% of Al, more especially up to about 10% of Al may be replaced (i.e. the A ions essentially consist of 90 or more mole % of Al and 10 or less mole % of one or more of Ga, Sc and In); B may especially comprise up to about 10% gallium. Therefore, B may comprise at least 90 atom % Al. Hence, $A_3B_5O_{12}:Ce^{3+}$ especially refers to $(Y_{1-x}Gd_x)_3Al_5O_{12}:Ce^{3+}$, wherein especially x is in the range of 0.1-0.5, even more especially in the range of 0.2-0.4.

In another variant, B (especially Al) and O may at least partly be replaced by Si and N. Optionally, up to about 20% of Al—O may be replaced by Si—N, such as up to 10%.

For the concentration of cerium, the indication n mole % Ce indicates that n % of A is replaced by cerium. Hence, $A_3B_5O_{12}:Ce^{3+}$ may also be defined as $(A_{1-n}Ce_n)_3B_5O_{12}$, with n being in the range of 0.001-0.035, such as 0.0015-0.01. Therefore, a garnet essentially comprising Y and mole Ce may in fact refer to $((Y_{1-x}Gd_x)_{1-n}Ce_n)_3B_5O_{12}$, with x and n as defined above.

Especially, the ceramic material is obtainable by a sintering process and/or a hot pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of the theoretical density. After both the pre-sintering and the heating, especially under elevated pressure, such as HIP, the density of the light transmissive body can be close to the density of a single crystal. However, a difference is that grain boundaries are available in the light transmissive body, as the light transmissive body is polycrystalline. Such grain boundaries can e.g. be detected by optical microscopy or SEM. Hence, herein the light transmissive body especially refers to a sintered polycrystalline having a density substantially identical to a single crystal (of the same material). Such body may thus be highly transparent for visible light (except for the absorption by the light absorbing species such as especially $Ce^{3+}$).

The luminescent concentrator may also be a crystal, such as a single crystal. Such crystals can be grown/drawn from the melt in a higher temperature process. The large crystal, typically referred to as boule, can be cut into pieces to form the light transmissive bodies. The polycrystalline garnets mentioned above are examples of materials that can alternatively also be grown in single crystalline form.

After obtaining the light transmissive body, the body may be polished. Before or after polishing an annealing process (in an oxidative atmosphere) may be executed, especially before polishing. In a further specific embodiment, the annealing process lasts for at least 2 hours, such as at least 2 hours at least 1200° C. Further, especially the oxidizing atmosphere comprises for example $O_2$.

Instead of cerium doped garnets, or in addition to such garnets, also other luminescent materials may be applied, e.g. embedded in organic or inorganic light transmissive matrixes, as luminescent concentrator. For instance quantum dots and/or organic dyes may be applied and may be embedded in transmissive matrices like e.g. polymers, like PMMA, or polysiloxanes, etc. etc. Other light transmissive material as host matrix may be used as well, see also below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphode (InP), and copper indium sulfide $(CuInS_2)$ and/or silver indium sulfide $(AgInS_2)$ can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, or nano-wires.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Several color conversion schemes may be possible. Especially, however, the Stokes shift is relatively small. Especially, the Stokes shift, defined as the difference (in wavelength) between positions of the band maxima of the light source used for pumping and the light which is emitted, is not larger than 100 nm; especially however, the Stokes shift is at least about 10 nm, such as at least about 20 nm. This may especially apply to the light source light to first luminescent material radiation conversion, but also apply to the second pump radiation to second luminescent material radiation conversion, etc.

In embodiments, the plurality of light sources are configured to provide UV radiation as first pump radiation, and the luminescent concentrators are configured to provide one or more of blue and green first converter radiation. In yet other embodiments, the plurality of light sources are configured to provide blue radiation as first pump radiation, and the luminescent concentrators are configured to provide one or more of green and yellow first converter radiation. Note, as also indicated below, such embodiments may also be combined.

Hence, in embodiments the light source is configured to provide one or more of UV and blue radiation, and the first luminescent material is configured to convert at least part of this light source light (i.e. one or more of UV and blue radiation) into one or more of blue, green, yellow, orange, and red (first) luminescent material light. The second luminescent material may be configured to convert part of the light source light and/or at least part of the first luminescent material light into one or more of blue, green, yellow, orange, and red (first) luminescent material light (but having a spectral distribution different from the spectral distribution of the first luminescent material). Different color schemes, optionally including one or more additional (solid-state) light sources may be used to provide white light.

The lighting device may thus essentially consist of the elongated light transmissive body comprising a first luminescent material and one or more, especially a plurality of light sources, which pump the first luminescent material to provide luminescent material light, that escapes from a radiation exit window (of an end face (second face)).

Further, the lighting device may comprise an optical element, such as a CPC or (other) extraction optical element, which may be configured downstream of the light transmissive body, but which in embodiments may be integrated with the light transmissive body.

Optionally, between this optical element and the light transmissive body, a radiation mixing element may be configured. Hence, a section of the light transmissive body of an additional element may be configured that acts as an optical mixing rod (especially not round, but e.g. hexagonal) between the converters and the CPC (or extraction optical element). Alternatively or additionally, the extraction optical element is designed such that it also mixes the light.

Further, the lighting device may comprise one or more holding elements for holding the light transmissive body. Especially, these holding elements have contact with the edge faces, but only with a small part thereof to minimize losses of light. For instance, the holding element(s), like clamping device (s) have contact with the edge faces over less than 10%, such as over less than 5% of the total area of the side faces. Further, the lighting device may comprise a heat sink and/or a cooling element. The holding element(s) may be comprised by the heat sink and/or cooling element.

The lighting device may be part of or may be applied in e.g. office lighting systems, household application systems, shop lighting systems, home lighting systems, accent lighting systems, spot lighting systems, theater lighting systems, architectural lighting, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting, etc. The lighting device may also be part of or may be applied in e.g. material curing systems, additive manufacturing systems, metrology systems, UV sterilization system, (IR) imaging systems, fiber illumination systems, etc. In an aspect, the invention also provides a projection system or a luminaire comprising the lighting device as described herein, or a plurality of such lighting devices.

In yet a further aspect, the invention provides a projector comprising the lighting device as defined herein (or the lighting system as defined herein; see also below). As indicated above, of course the light projector may also include a plurality of such lighting devices.

In yet a further aspect, the invention also provides a lighting system configured to provide lighting system light, the lighting system comprising one or more lighting devices as defined herein. Here, the term "lighting system" may also be used for a (digital) projector. Further, the lighting device may be used for e.g. stage lighting (see further also below), or architectural lighting. Therefore, in embodiments the invention also provides a lighting system as defined herein, wherein the lighting system comprises a digital projector, a stage lighting system or an architectural lighting system. The lighting system may comprise one or more lighting devices as defined herein and optionally one or more second lighting devices configured to provide second lighting device light, wherein the lighting system light comprises (a) one or more of (i) the converter radiation as defined herein, and optionally (b) second lighting device light. Hence, the invention also provides a lighting system configured to provide visible light, wherein the lighting system comprises at least one lighting device as defined herein. For instance, such lighting system may also comprise one or more (additional) optical elements, like one or more of optical filters, collimators, reflectors, wavelength converters, lens elements, etc. The lighting system may be, for example, a lighting system for use in an automotive application, like a headlight. Hence, the invention also provides an automotive lighting system configured to provide visible light, wherein the automotive lighting system comprises at least one lighting device as defined herein and/or a digital projector system comprising at least one lighting device as defined herein. Especially, the lighting device may be configured (in such applications) to provide red light. The automotive lighting system or digital projector system may also comprise a plurality of the lighting devices as described herein.

In yet a further aspect (or embodiment of the above lighting system), the invention also provides lighting system comprising one or more lighting devices according to any one of the preceding claims, and a control system, wherein two or more luminescent element are configured to provide luminescent material light with different spectral power distributions, and wherein the control system is configured to control one or more sets of light sources.

Alternatively, the lighting device may be designed to provide high intensity UV radiation, e.g. for 3D printing technologies or UV sterilization applications. Alternatively, the lighting device may be designed to provide a high intensity IR light beam, e.g., to project IR images for (military) training purposes.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL, such as within about 3 SDCM from the BBL.

The terms "violet light" or "violet emission" especially relates to light having a wavelength in the range of about 380-440 nm. The terms "blue light" or "blue emission" especially relate to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-570 nm. The terms "orange light" or "orange emission" especially relate to light having a wavelength in the range of about 570-600. The terms "red light" or "red emission" especially relate to light having a wavelength in the range of about 600-780 nm. The term "pink light" or "pink emission" refers to light having a blue and a red component. The terms "visible", "visible light" or "visible emission" refer to light having a wavelength in the range of 380-780 nm. The term UV light may be UV-A (315-400 nm); UV-B (280-315 nm) or UV-C (200-280 nm). The term IR light may be light in the range above 780 nm. The term "white light" may in embodiments refer to light consisting of particular spectral compositions of wavelengths in the range between 380-780 nm, perceived nearby Planck's black body radiators having temperatures of about 1000 K and above.

The elongated light transmissive body, and optionally also the optical element, may comprise light transmissive host material (thus not taking into account the first luminescent material, or more especially in embodiments a luminescent species such as trivalent cerium), especially light transparent material for one or more wavelengths in the visible, such as in the green and red, and in general also in the blue. Suitable host materials may comprise one or more materials selected from the group consisting of a transmissive organic material, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), including in an embodiment (PETG) (glycol modified polyethylene terephthalate), PDMS (polydimethylsiloxane), and COC (cyclo olefin copolymer). Especially, the light transmissive material may comprise an aromatic polyester, or a copolymer thereof, such as e.g. polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN); especially, the light transmissive material may comprise polyethylene terephthalate (PET). Hence, the light transmissive material is especially a polymeric light transmissive material.

However, in another embodiment the light transmissive material may comprise an inorganic material. Especially, the inorganic light transmissive material may be selected from the group consisting of glasses, (fused) quartz, transmissive ceramic materials (such as garnets), and silicones. Glass ceramic materials may also be applied. Also hybrid materials, comprising both inorganic and organic parts may be applied. Especially, the light transmissive material comprises one or more of PMMA, transparent PC, or glass.

When a luminescent material, like an inorganic luminescent material, quantum dots, organic molecules, etc., are embedded in a host matrix, the concentration of the first luminescent material may in embodiments be selected from the range of 0.01-5 wt % (weight %), such as 0.01-2 wt %.

High brightness light sources may be used in e.g. front projectors, rear projectors, studio lighting, stage lighting, entertainment lighting, automotive front lighting, architectural lighting, augmented illumination (incl. data/content), microscopy, metrology, medical applications, e.g. digital pathology, etc.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

A light emitting device according to the invention may be used in applications including but not being limited to a lamp, a light module, a luminaire, a spot light, a flash light, a projector, a (digital) projection device, automotive lighting such as e.g. a headlight or a taillight of a motor vehicle, arena lighting, theater lighting and architectural lighting.

Light sources which are part of the embodiments according to the invention as set forth below, may be adapted for, in operation, emitting light with a first spectral power distribution. This light is subsequently coupled into a light guide or waveguide; here the light transmissive body. The light guide or waveguide may convert the light of the first spectral power distribution to another spectral power distribution and guides the light to an exit surface.

Figure 1A:
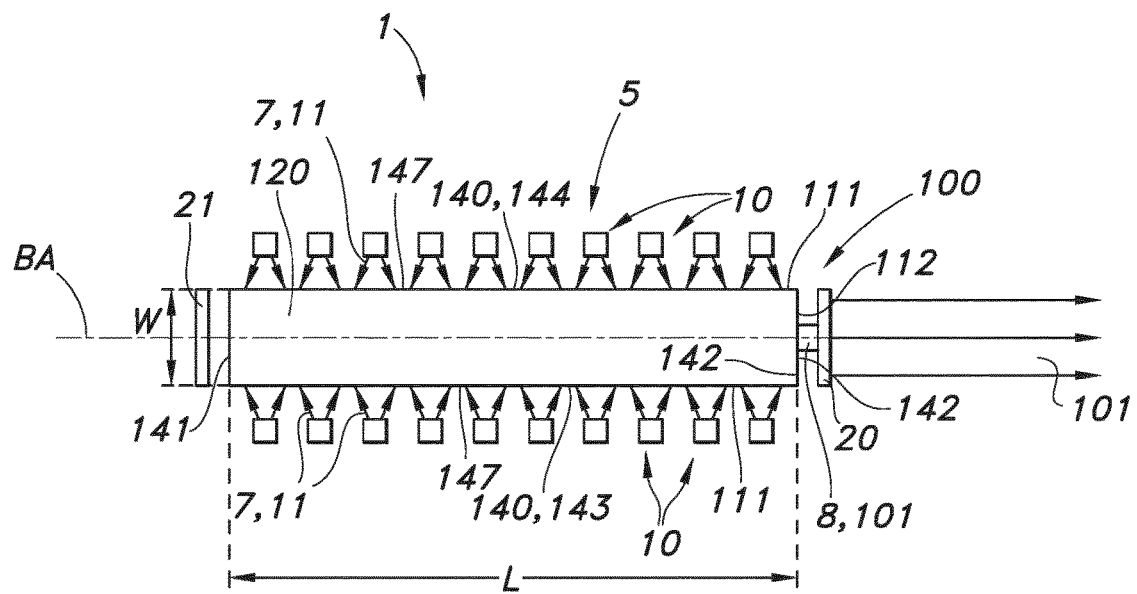
FIGS. 1a-1e schematically depict some aspects of the invention, but not yet including the light guide element and the second luminescent material.

An embodiment of the lighting device as defined herein is schematically depicted in FIG. 1a. FIG. 1a schematically depicts a lighting device 1 comprising a plurality of solid-state light sources 10 and a luminescent concentrator 5 comprising an elongated light transmissive body 100 having a first face 141 and a second face 142 defining a length L of the elongated light transmissive body 100. The elongated light transmissive body 100 comprising one or more radiation input faces 111, here by way of example two oppositely arranged faces, indicated with references 143 and 144 (which define e.g. the width W), which are herein also indicated as edge faces or edge sides 147. Further the light transmissive body 100 comprises a radiation exit window 112, wherein the second face 142 comprises the radiation exit window 112. The entire second face 142 may be used or configured as radiation exit window. The plurality of solid-state light sources 10 are configured to provide (blue) light source light 11 to the one or more radiation input faces 111. As indicated above, they especially are configured to provide to at least one of the radiation input faces 111 a blue power $W_{opt}$ of in average at least 0.067 Watt/mm$^2$. Reference BA indicates a body axis, which will in cuboid embodiments be substantially parallel to the edge sides 147. Reference 140 refers to side faces or edge faces in general.

The elongated light transmissive body 100 may comprise a ceramic material 120 configured to wavelength convert at least part of the (blue) light source light 11 into converter light 101, such as at least one or more of green and red converter light 101. As indicated above the ceramic material 120 comprises an $A_3B_5O_{12}:Ce^{3+}$ ceramic material, wherein A comprises e.g. one or more of yttrium (Y), gadolinium (Gd) and lutetium (Lu), and wherein B comprises e.g. aluminum (Al). References 20 and 21 indicate an optical filter and a reflector, respectively. The former may reduce e.g. non-green light when green light is desired or may reduce non-red light when red light is desired. The latter may be used to reflect light back into the light transmissive body or waveguide, thereby improving the efficiency. Note that more reflectors than the schematically depicted reflector may be used. Note that the light transmissive body may also essentially consist of a single crystal, which may in embodiments also be $A_3B_5O_{12}:Ce^{3+}$.

The light sources may in principle be any type of light source, but is in an embodiment a solid-state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the UV and/or blue color-range which is defined as a wavelength range of between 380 nm and 490 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

The light sources 10 are configured to provide light source light 11, which is used as pump radiation 7. The first luminescent material 120 converts the light source light into luminescent material light 8 (see also FIG. 1e). Light escaping at the light exit window is indicated as converter light 101, and will include luminescent material light 8. Note that due to reabsorption part of the first luminescent material light 8 within the luminescent concentrator 5 may be reabsorbed. Hence, the spectral power distribution may be redshifted relative e.g. a low doped system and/or a powder of the same material. The lighting device 1 may be used as luminescent concentrator to pump another luminescent concentrator. FIG. 1e also shows that the radiation input face(s) 111 and the radiation exit window 112 of the luminescent body 100 have mutual angles α larger than 0° and smaller than 180°. Here, the angle is 90°. Hence, in this way the radiation input face(s) 111 and luminescent element exit window, here the radiation exit window 112, have (a) mutual angle(s) α larger than 0° and smaller than 180°.

Figure 1B:
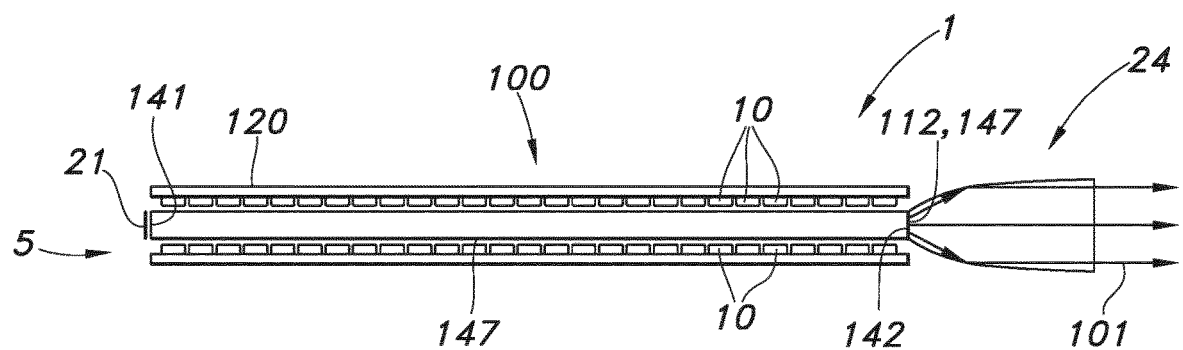

FIGS. 1a-1b schematically depict similar embodiments of the lighting device. Further, the lighting device may include further optical elements, either separate from the waveguide and/or integrated in the waveguide, like e.g. a light concentrating element, such as a compound parabolic light concentrating element (CPC). The lighting devices 1 in FIG. 1b further comprise a collimator 24, such as a CPC.

As shown in FIGS. 1a-1b and other Figures, the light guide has at least two ends, and extends in an axial direction between a first base surface (also indicated as first face 141) at one of the ends of the light guide and a second base surface (also indicated as second face 142) at another end of the light guide.

Figure 1C:
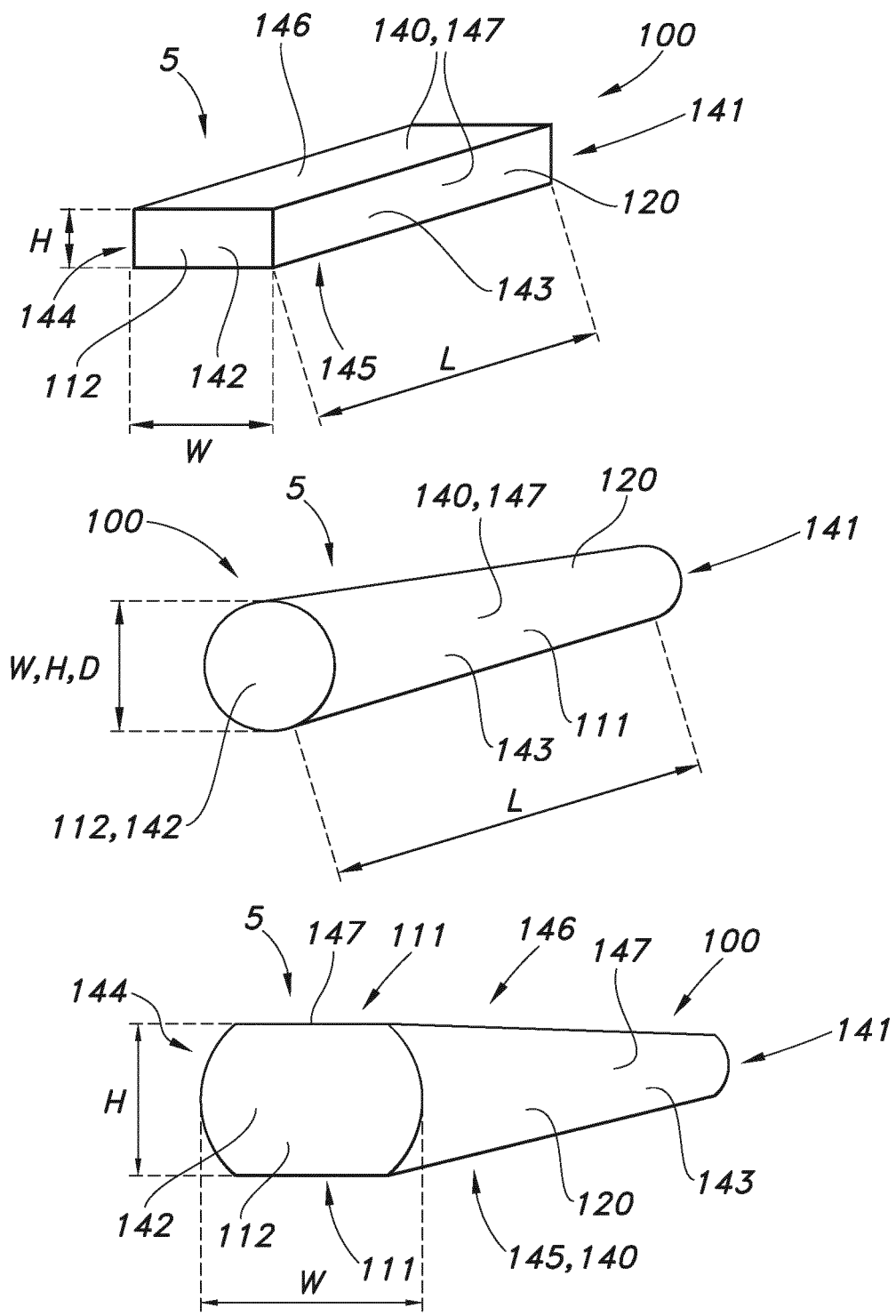

FIG. 1c schematically depicts some embodiments of possible ceramic bodies or crystals as waveguides or luminescent concentrators. The faces are indicated with references 141-146. The first variant, a plate-like or beam-like light transmissive body has the faces 141-146. Light sources, which are not shown, may be arranged at one or more of the faces 143-146 (general indication of the edge faces is reference 147). The second variant is a tubular rod, with first and second faces 141 and 142, and a circumferential face 143. Light sources, not shown, may be arranged at one or more positions around the light transmissive body. Such light transmissive body will have a (substantially) circular or round cross-section. The third variant is substantially a combination of the two former variants, with two curved and two flat side faces.

In the context of the present application, a lateral surface of the light guide should be understood as the outer surface or face of the light guide along the extension thereof. For example in case the light guide would be in form of a cylinder, with the first base surface at one of the ends of the light guide being constituted by the bottom surface of the cylinder and the second base surface at the other end of the light guide being constituted by the top surface of the cylinder, the lateral surface is the side surface of the cylinder. Herein, a lateral surface is also indicated with the term edge faces or side 140.

The variants shown in FIG. 1c are not limitative. More shapes are possible; i.e. for instance referred to WO2006/054203, which is incorporated herein by reference. The ceramic bodies or crystals, which are used as light guides, generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. Hence, the aspect ratio (of length/width) is especially larger than 1, such as equal to or larger than 2, such as at least 5, like even more especially in the range of 10-300, such as 10-100, like 10-60, like 10-20. Unless indicated otherwise, the term "aspect ratio" refers to the ratio length/width. FIG. 1c schematically depicts an embodiment with four long side faces, of which e.g. two or four may be irradiated with light source light.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Note that in all embodiments schematically depicted herein, the radiation exit window is especially configured perpendicular to the radiation input face(s). Hence, in embodiments the radiation exit window and radiation input face(s) are configured perpendicular. In yet other embodiments, the radiation exit window may be configured relative to one or more radiation input faces with an angle smaller or larger than 90°.

Note that, in particular for embodiments using a laser light source to provide light source light, the radiation exit window might be configured opposite to the radiation input face(s), while the mirror 21 may consist of a mirror having a hole to allow the laser light to pass the mirror while converted light has a high probability to reflect at mirror 21. Alternatively or additionally, a mirror may comprise a dichroic mirror.

Figure 1D:
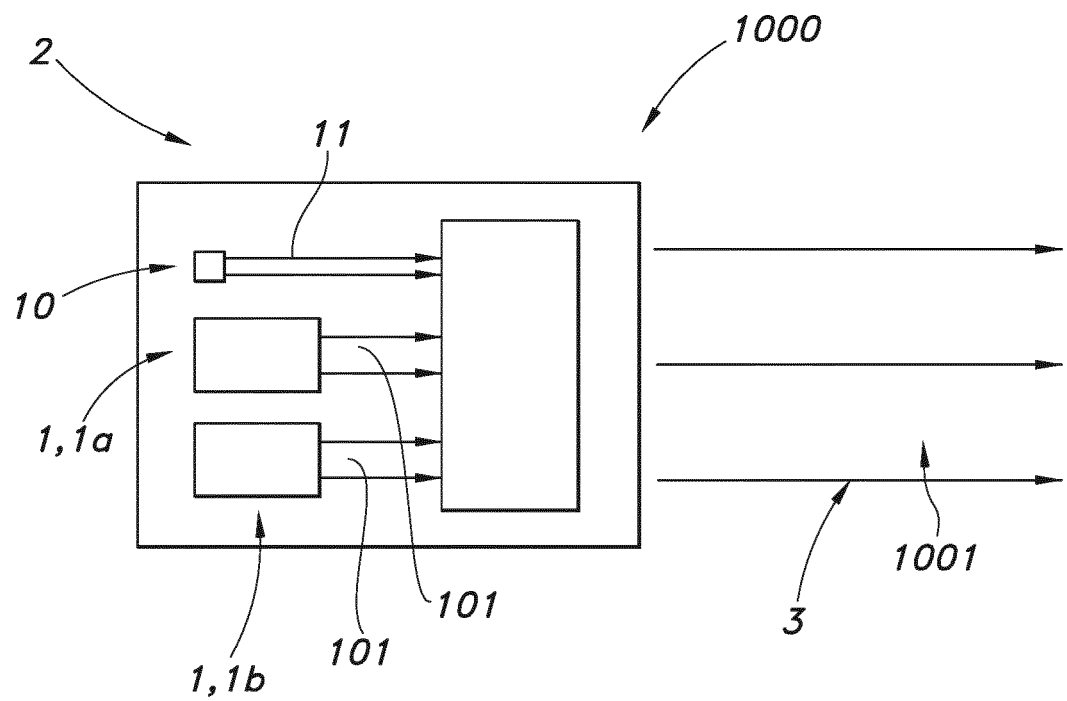
Figure 1E:
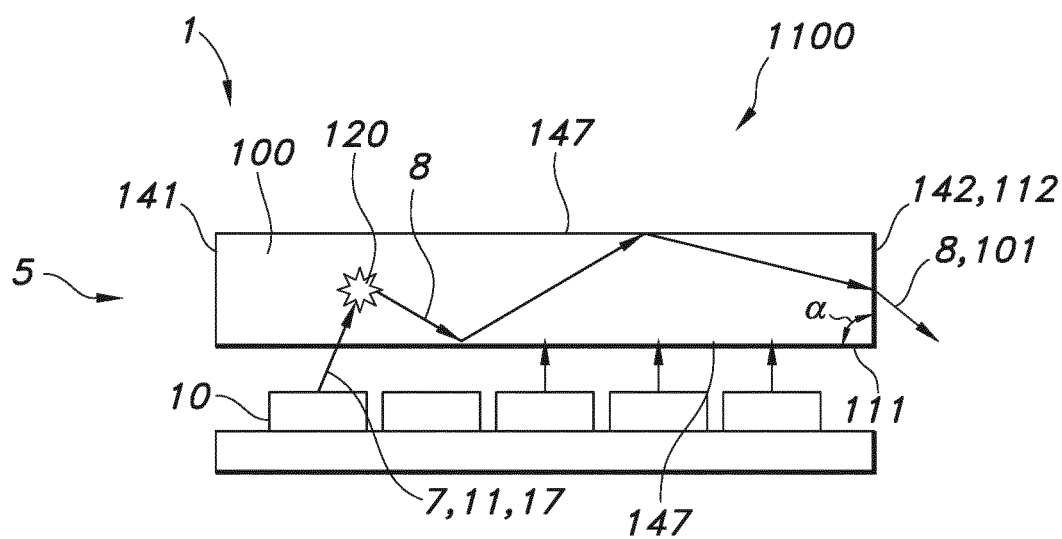

FIG. 1d very schematically depicts a projector or projector device 2 comprising the lighting device 1 as defined herein. By way of example, here the projector 2 comprises at least two lighting devices 1, wherein a first lighting device (1a) is configured to provide e.g. green light 101 and wherein a second lighting device (1b) is configured to provide e.g. red light 101. Light source 10 is e.g. configured to provide blue light. These light sources may be used to provide the projection (light) 3. Note that the additional light source 10, configured to provide light source light 11, is not necessarily the same light source as used for pumping the luminescent concentrator(s). Further, here the term "light source" may also refer to a plurality of different light sources. The projector device 2 is an example of a lighting system 1000, which lighting system is especially configured to provide lighting system light 1001, which will especially include lighting device light 101. Further examples of a lighting system 1000 are a luminaire or a spot light.

High brightness light sources are interesting for various applications including spots, stage-lighting, headlamps and digital light projection.

For this purpose, it is possible to make use of so-called luminescent concentrators where shorter wavelength light is converted to longer wavelengths in a highly transparent luminescent material. A rod of such a transparent luminescent material can be used and then it is illuminated by LEDs to produce longer wavelengths within the rod. Converted light which will stay in the first luminescent material such as a doped garnet in the waveguide mode and can then be extracted from one of the surfaces leading to an intensity gain (FIG. 1e). FIG. 1e, but also other figures may also effectively schematically depict a luminaire 1100. The luminaire may further comprise one or more optics downstream of the device 1 (not depicted in FIG. 1e). Further, the luminaire may comprise a control system (not depicted) configured to control the light sources, or subsets of light sources.

High-brightness LED-based light source for beamer applications appear to be of relevance. For instance, the high brightness may be achieved by pumping a luminescent concentrator rod by a discrete set of external blue LEDs, whereupon the phosphor that is contained in the luminescent rod subsequently converts the blue photons into green or red photons. Due to the high refractive index of the luminescent rod host material (typically 1.8) the converted green or red photons are almost completely trapped inside the rod due to total internal reflection. At the exit facet of the rod the photons are extracted from the rod by means of some extraction optics, e.g. a compound parabolic concentrator (CPC), or a micro-refractive structure (micro-spheres or pyramidal structures). As a result, the high luminescent power that is generated inside the rod can be extracted at a relatively small exit facet, giving rise to a high source brightness, enabling (1) smaller optical projection architectures and (2) lower cost of the various components because these can be made smaller (in particular the, relatively expensive, projection display panel).

It is desired to have a high brightness light source based on the principle described above and put them in a matrix. For this purpose, rods can be placed close to each other. However, in that case there is no room for heat sinking. In order to overcome this problem, we suggest a pixelated luminescent rod configuration wherein multiple luminescent rods are positioned in a tapered arrangement. Neighboring rods are extending at a tapering angle which is e.g. selected from the range of 5 to 40°. Each rod can be pumped by a separate LED array and enclosed by a heat sink to allow for pixelated light and avoid cross-talks. Heat sinks may also be tapered shaped to improve cooling and heat transfer. There is also a problem with the tapered configuration as the surface area of the rods become larger with increasing angles. For example, a rod with an area of 4 mm$^2$ at 0° increases its area to become 9 mm$^2$ at 50°. For this purpose, in embodiments the size of the rods is changed such that at the exit surface they all have the same dimensions. Raytracing simulations have been used to assess the efficiency of the tapered rod arrangement and find most optimal configurations.

Hence, in order to overcome above mentioned problems, amongst others we suggest a pixelated luminescent rod configuration wherein multiple luminescent rods are positioned in a tapered arrangement. Especially, neighboring rods are extending at a tapering angle θ which is selected from the range of 5–40°. More especially, neighboring rods are extending at a tapering angle which is selected from the range of 8–35°. In specific embodiments, neighboring rods are extending at a tapering angle which is selected from the range of 10–30°. For instance, each rod may be pumped by a separate set of LED array and enclosed by a heat sink to allow for pixelated light and avoid cross-talks.

Figure 2A:
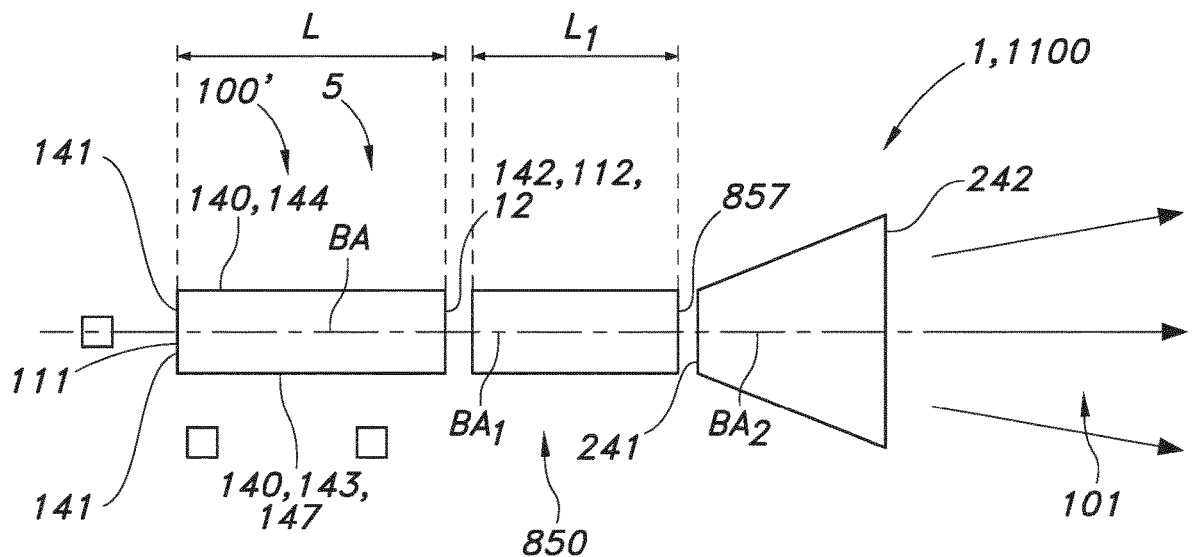
FIGS. 2a-2b schematically depict some aspects of the invention, but not yet including the light guide element.
Figure 2B:
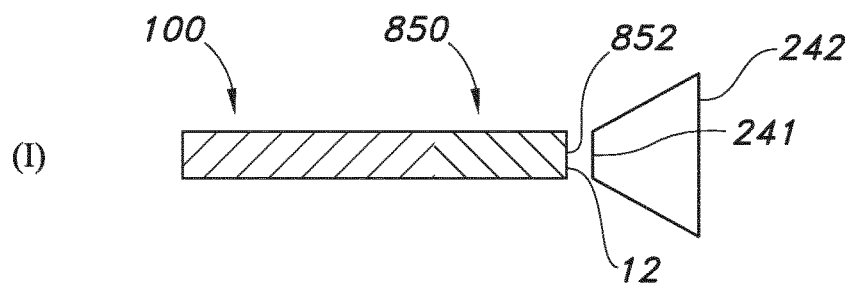
Figure 2B:
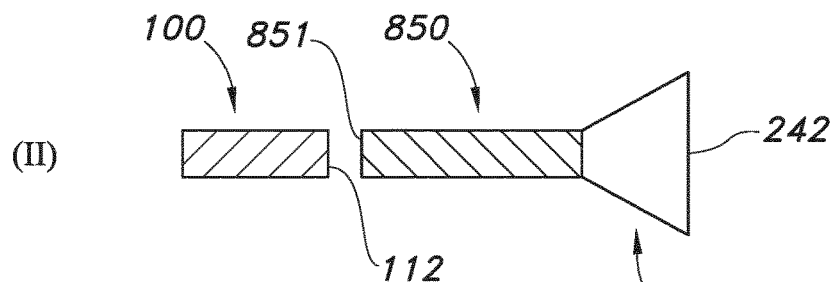
Figure 2B:
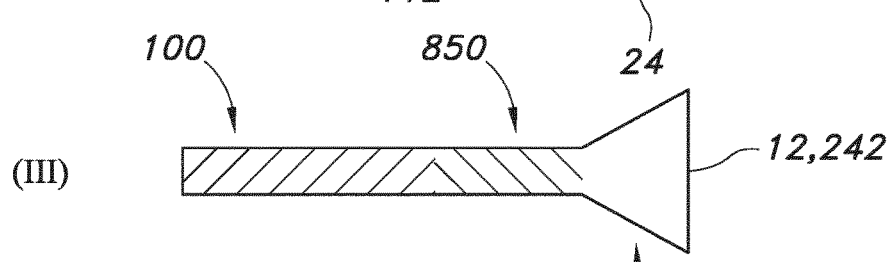

FIG. 2a-2b schematically depict some aspects of the lighting device, but not yet including the second luminescent material.

Note that herein the lighting device 1 is generally depicted with collimating elements. However, also a lens may be applied.

In FIGS. 2a-2b reference 12 indicates the luminescent element exit window, which in FIG. 2a essentially coincides with the radiation exit window 112 of the elongated body 100. Reference 850 indicates the light guide element. Here, the light guide element 850 has a length L1, a radiation entrance window 851 (herein also indicated as light guide element input surface) and a radiation exit window 852 (herein also indicated as light guide element exit surface). References 241 and 241 indicate the radiation entrance window and radiation exit window, respectively, of the optical element 24. Distances are drawn between the elements, but the elements may be in optical contact, such as via an optical glue or by physical contact.

By way of example, FIG. 2a also depicts a light source 10 that radiation input face 111. Optionally, this light source 10 may essentially be used to pump the second luminescent material (see further below for its location).

References BA, BA1, and BA2 refers to the body axis (and here also optical axes) of the respective elements (i.e. body 100, element 850, and element 24). References BA and BA2 may thus also refer to the axes of elongation, respectively.

Reference 1100 indicates a luminaire. Not depicted, but the luminaire may further comprise a reflector and/or other optics, a housing, a control system, etc. etc.

FIG. 2b schematically depicts some embodiments or variants, wherein I refers to an embodiment wherein the light guide element 850 is an extension of the elongated body 100, wherein II refers to an embodiment wherein the light guide element 850 is an extension of the optical element 24, and wherein III refers to an embodiment wherein the elongated body 100, the light guide element 850 and the optical element 240 are a single body. Note that the cross-sectional dimensions of the light guide element and the elongated body may essentially be the same, in all these embodiments/variants, whereas the cross-sectional dimensions of the optical element 24 may be different therefrom (and may also vary over its length).

As indicated above, it may be desired to produce light sources giving white light and also saturated light based on such a concentrator. For this purpose, one can place a phosphor layer at the end of the rod i.e. between the CPC and the luminescent light concentrator where the components are glued together. However, in operation due to the excess heat generation at this position as a result of light conversion (stoke shift losses) reliability of the construction is reduced.

Figure 2C:
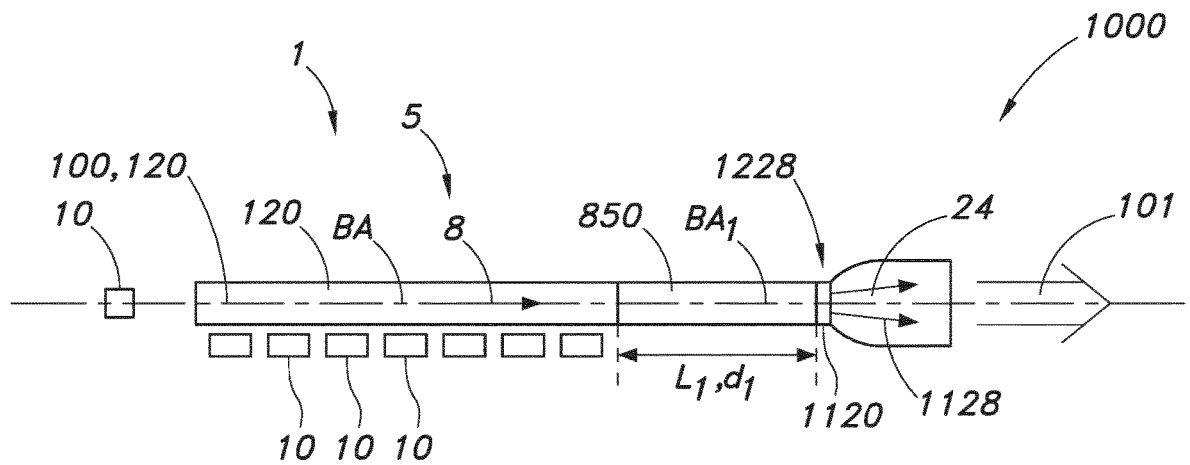
FIG. 2c-2h schematically depicts some possible embodiments.

Here, we suggest first using a transparent light guide and glue it to the luminescent light concentrator and place the phosphor at the end of the light guide where it is joined to the optical element, such as a CPC, where the light guide and the optical element, such as the CPC, may be made of the same material (FIG. 2c).

FIG. 2c schematically depicts an embodiment lighting device 1 comprising one or more light sources 10 configured to provide light source light. The device 1 further comprises a luminescent element 5 comprising an elongated luminescent body 100 having a radiation input face 111 (though in fact here at least two) for receipt of the light source light 11. The luminescent element 5 comprises a first luminescent material 120 for conversion of at least part of the light source light 11 into luminescent material light 8. Reference 1228 indicates a luminescent material layer comprising the second luminescent material 1120.

The device 1 further comprises a light guide element 850, configured downstream of the first luminescent material 120, and configured to light guide at least part of the first luminescent material light 8.

The device also comprises a second luminescent material 1120, configured downstream of the first luminescent material 120, at a first distance d1 of e.g. at least 0.5 mm thereof, configured to convert one or more of at least part of the light source light 11 and at least part of the first luminescent material light 8 into second luminescent material light 1128 having a (second) spectral power distribution differing from a (first) spectral power distribution of the first luminescent material light 8.

Further, the device comprises a light transmissive optical element 24 configured downstream of the light guide element 850, configured to receive at least part of the first luminescent material light 8 of the light guide element 850 and (/or) to receive at least part of the second luminescent material light 1128. The optical element is here also configured to transmit the received luminescent material light 8 and the received second luminescent material light 1128, and configured to beam shape at least part of the received luminescent material light, and to provide lighting device light 101 comprising one or more of the light source light 11, the first luminescent material light 8 and the second luminescent material light 1128.

In an embodiment, the optical element 24, such as a CPC, may have the light guide element 850 as an extension. The light guide element (part) or the optical element, or both, may which comprise a phosphor, see FIG. 2d. In this way, the reliability problem can (further) be solved.

Figure 2D:
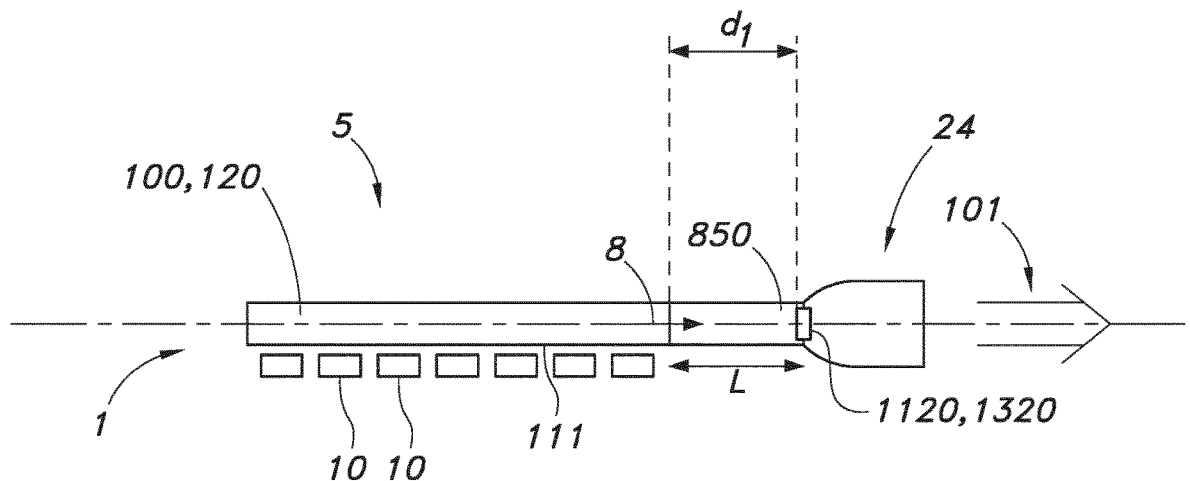
Figure 2E:
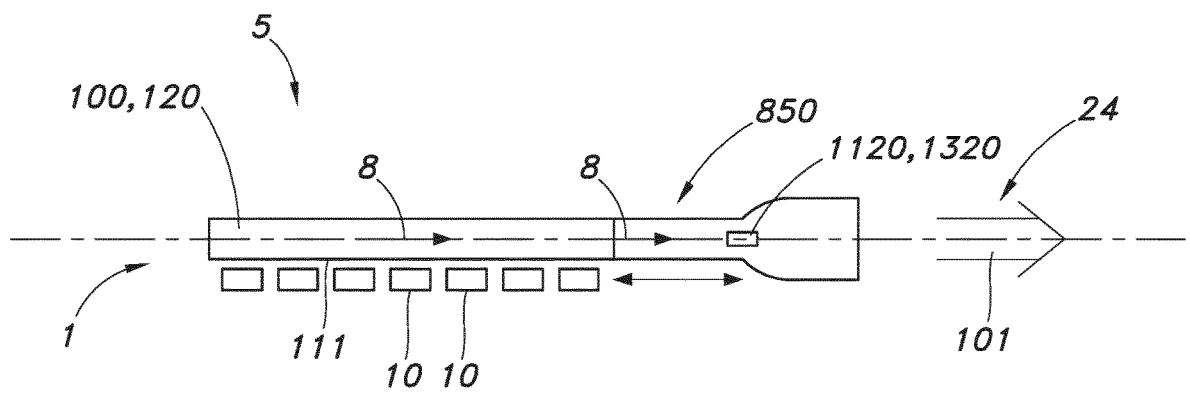

In embodiments, the phosphor layer covers the complete width and height of the light guide (see e.g. FIG. 2c). The obtained effect is improved homogeneous light conversion. In FIGS. 2d and 2e, schematically embodiments are depicted wherein the first luminescent material 1120 is configured such (i.e. phosphor concentration and thickness) that partial phosphor conversion is obtained. The obtained effect is that light of the luminescent concentrator and light of the phosphor layer is exiting the light exit of the optical element, such as a lens or CPC. For instance, in embodiments the luminescent material (layer) covers a part of the width and height of the light guide (see FIGS. 2c and 2d). The obtained effect may be an improved color control.

Figure 2F:
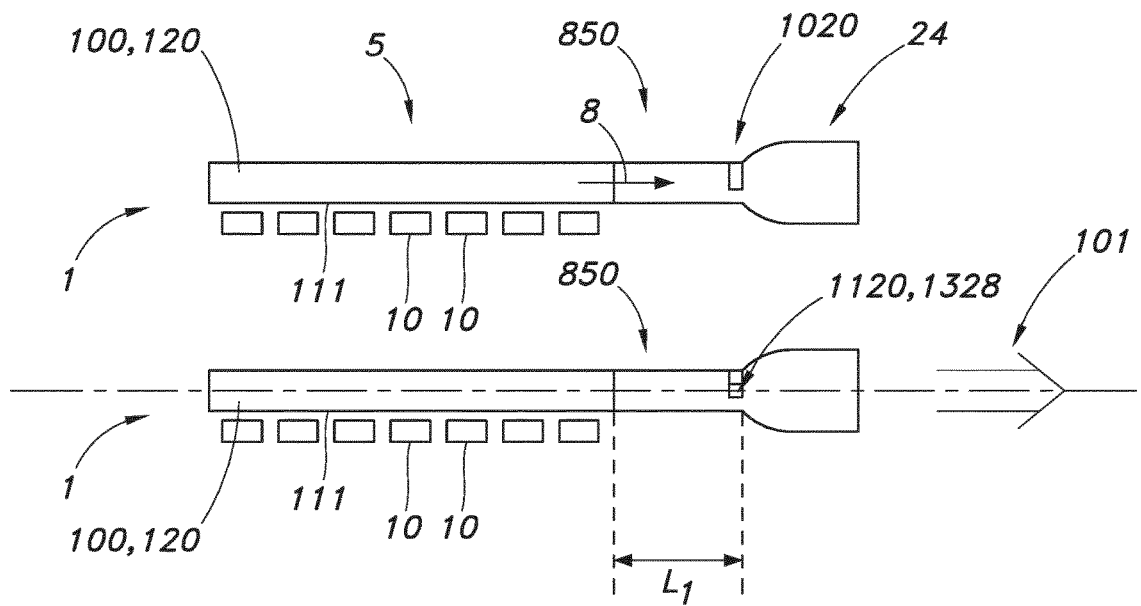

In embodiments, the phosphor (layer), herein also indicated as luminescent material (layer) may also be a phosphor element. The phosphor may be positioned in a cavity of the CPC or of the light guide. The obtained effect may be improved reliability. For instance, it may be inserted or injected into the optical element, such as the CPC, from the top (FIG. 2f). The obtained effect may be even further improved reliability. FIG. 2f schematically depicts an embodiment of the lighting device 1 comprising a second luminescent body 1328 comprising the second luminescent material 1120, wherein one or more of the light guide element 850 and the light transmissive optical element 24 comprise a receptor cavity 1020 for hosting the second luminescent body 1328.

Hence, the elongated light transmissive body 100 may also be indicated as "first elongated light transmissive body" (and equivalent terms, like "first luminescent body", etc.)

Of course, the second luminescent material may also comprise (a combination of) two or more different luminescent material. The luminescent materials may be mixed or stacked, but may also be configured at different positions. The obtained effect is improved light quality/spectral tuning.

Figure 2G:
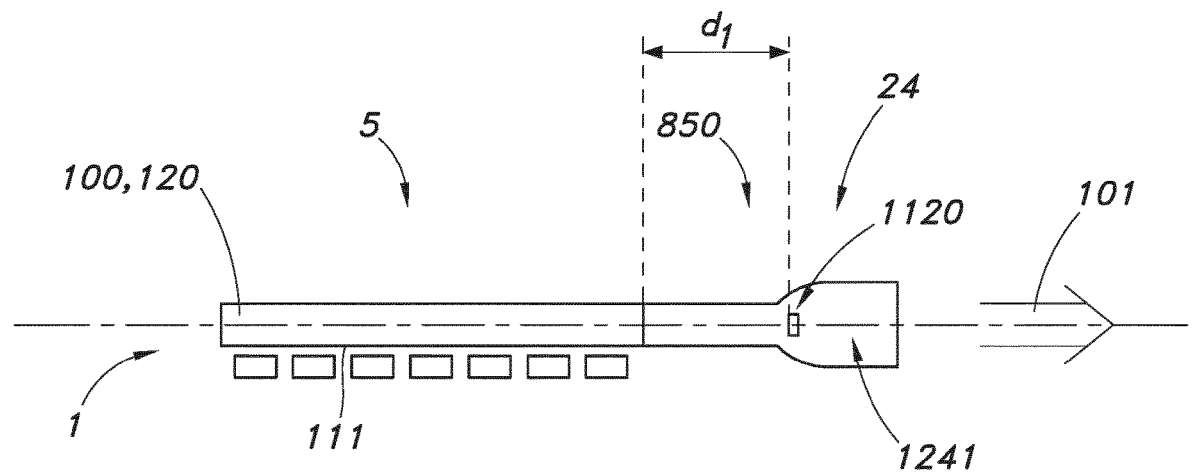

In FIG. 2g, the conditions of the first luminescent material being available in the elongated luminescent body with a first concentration c1, and the same luminescent material optionally being available in the light guide element, with a second concentration c2, wherein $0 \leq c2/c1 \leq 0.05$, such as $0 \leq c2/c1 \leq 0.01$ also applies, especially also the condition of the first luminescent material not being available in the light guide element ($c2/c1=0$) may apply, as the first luminescent material may not be available in the material of the light guide element 850 or the material of the light transmissive optical element 24, but only in the second luminescent body 1328 (in the cavity 1020). The same may thus apply for the condition of $0 \leq c3/c1 \leq 0.05$.

In embodiments, the second luminescent material 1120 is configured at the entrance of the collimating part of the collimator, such as a CPC. The second luminescent material 1120 may also be positioned in the collimating part of the collimator, such as the CPC. The collimator, such as the CPC, may be designed such that it allows improved light collimation. The obtained effect may be that less light is entering the luminescent rod again (see FIG. 2g).

Figure 2H:
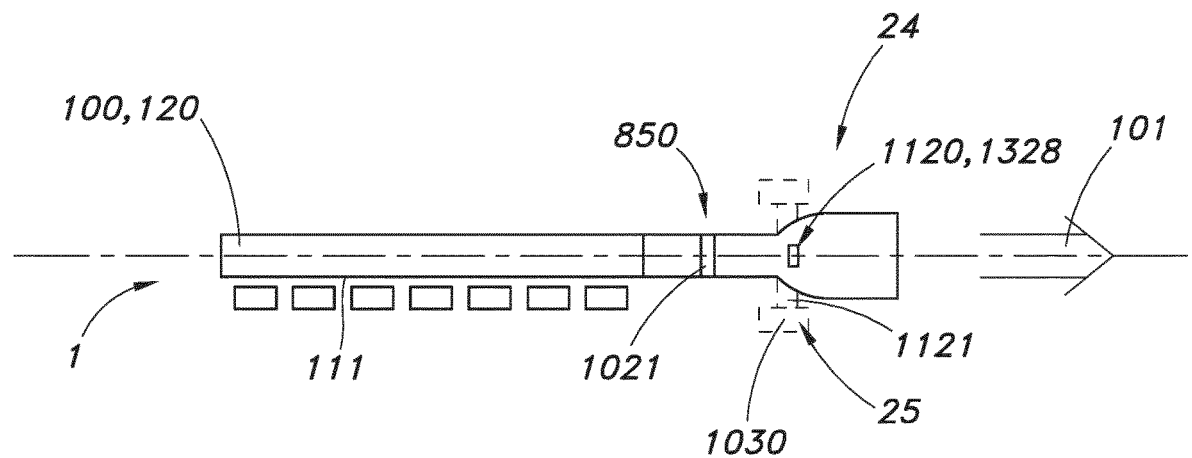

The optical element and/or light guide may comprise a dichroic mirror 1021 (see FIG. 2h). In embodiments, the dichroic mirror is placed between the luminescent light concentrator and the phosphor layer. The dichroic layer redirects the converted light to the light exit of the optical element, such as the CPC. The obtained effect is improved efficiency.

The optical element 24, such as a collimator, like especially a CPC, which may comprise the second luminescent material, such as the second luminescent body 1328, may also comprise a reflector 1121. Light which is converted by the phosphor layer and is not confined by total internal reflection is redirected (FIG. 2h). The obtained effect is improved efficiency. The reflector is especially a diffuse reflector. The reflector 1121 may be connected to a heat sink 1030. The obtained effect is improved cooling and thus it is possible to achieve higher intensity. The optional reflector(s) 1121 and the optional heat sink(s) 1030 are drawn dashed.

The device may comprise multiple second luminescent materials, optionally configured as layers and/or as luminescent bodies 1328 layers positioned in the light guide and/or optical element.

The height H of the elongated body 100 is especially in the range from 0.2 to 5 mm. The width W of the elongated body 100 is especially in the range from 0.2 to 5 mm.

The ratio of the H and W is in the range from 0.4 to 2.5. The length L of the elongated body 100 is in the range from 10 to 200 mm.

The length L1 of the light guide or extension of the CPC is especially in the range from 1 to 20 mm. More especially, the length L of the light guide or extension of the CPC is in the range from 3 to 15 mm. Most especially, the length L of the light guide or extension of the CPC is in the range from 4 to 10 mm.

The width and/or height of the light guide 850 is especially essentially identical to the width and/or height of the elongated body 100.

The second luminescent material may also comprise scattering materials such as for example scattering particles e.g. $Al_2O_3$, $BaSO_4$ and/or $TiO_2$ particles.

Especially, d1 is at least 50% of L1, like at least 100%. In embodiments, d1=L1, or may even be larger.

The herein suggested lighting device may also be combined with other light sources such as for example a LED or a laser diode(s). Such light source may e.g. be configured to provide one or more of blue, green, yellow, orange and red light source light. Light of such other light source (or "additional light source") may be coupled into the elongated body and/or (directly) into the light guide element and/or the optical element. When (directly) coupling into the light guide element, light of the other light source may be (better) mixed with the first luminescent material light. It may for example be combined with a blue light emitting diode.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. Where stated that an absorption, a reflection or a transmission should be a certain value or within a range of certain values these values are valid for the intended range of wavelengths. Such, if stated that the transmission of an elongated luminescent light transmissive body is above 99%/cm, that value of 99%/cm is valid for the converted light rays within the desired range of wavelengths emitted by the lighting device 1, while it would be clear to the person skilled in the art that the transmission of an elongated luminescent light transmissive body will be well below 99%/cm for the range of wavelengths emitted by the light sources 10, since the source light 11 is intended to excite the phosphor material in the elongated luminescent light transmissive bodies such that all the source light 11 especially is absorbed by the elongated luminescent light transmissive bodies instead of highly transmitted.

The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Practical designs may be further optimized the person skilled in the art using optical ray trace programs, such particular angles and sizes of microstructures (reflective microstructures or refractive microstructures) may be optimized depending on particular dimensions, compositions and positioning of the one or more elongated light transmissive bodies.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising:
   a plurality of light sources configured to provide light source light;
   a luminescent element comprising an elongated luminescent body having a radiation input face for receipt of the light source light, the luminescent element comprising a first luminescent material for conversion of at least part of the light source light into first luminescent material light;
   a light guide element, configured downstream of the elongated luminescent body and downstream of the first luminescent material, and configured to guide at least part of the first luminescent material light, wherein the light guide element is physically separate from the elongated luminescent body and does not comprise a luminescent material;
   a second luminescent material, configured downstream of the first luminescent material, at a first distance (d1) thereof, and configured downstream of the light guide element, the second luminescent material further configured to convert one or more of (i) at least part of the light source light and (ii) part of the first luminescent material light into second luminescent material light having a spectral power distribution differing from a spectral power distribution of the first luminescent material light;
   a light transmissive optical element configured downstream of the light guide element, configured to receive at least part of the first luminescent material light of the light guide element and configured to transmit the received first luminescent material light and the second luminescent material light, and configured to beam shape at least part of the received first luminescent material light, and to provide lighting device light comprising one or more of the first luminescent material light and the second luminescent material light,
   wherein the radiation input face is configured parallel to a body axis of elongation (BA) of the elongated luminescent body, and wherein the light sources are configured to directly provide the light source light only to the radiation input face of the elongated luminescent body, and
   wherein the only light source light provided to the lighting device being via the input face of the elongated luminescent body.

2. The lighting device according to claim 1, wherein the light transmissive optical element comprises the second luminescent material.

3. The lighting device according to claim 2, wherein the light transmissive optical element comprises an optical element cavity configured to beam shape at least part of the first luminescent material light received via the light guide element, wherein the optical element cavity comprises the second luminescent material.

4. The lighting device according to claim 1, wherein the light guide element and the light transmissive optical element comprise the same material, wherein the elongated luminescent body and the light transmissive optical element have different material compositions, and wherein the light guide element and the light transmissive optical element both comprise one or more materials selected from the group consisting of a glass, sapphire, quartz, a ceramic material, an essentially undoped garnet, and a single crystalline material.

5. The lighting device according to claim 1, wherein the elongated luminescent body and the light guide element are optically coupled.

6. The lighting device according to claim 1, comprising a luminescent material layer configured between the light guide element and the light transmissive optical element, wherein the luminescent material layer comprises the second luminescent material.

7. The lighting device according to claim 1, wherein the light transmissive optical element comprises a compound parabolic collimator.

8. The lighting device according to claim 1, further comprising a second luminescent body comprising the second luminescent material, wherein the light transmissive optical element comprises a receptor cavity for hosting the second luminescent body.

9. The lighting device according to claim 1, wherein the light guide element and the light transmissive optical element are a single body, consisting of the same material.

10. The lighting device according to claim 1, wherein the light guide element is elongated, having a length (L1) selected from the range of 0.5-20 mm, wherein the elongated luminescent body has a body axis of elongation (BA), wherein the light guide element has a body axis (BA1), wherein the body axes (BA,BA1) are collinear, and wherein the first distance (d1) is at least 0.5 mm.

11. The lighting device according to claim 1, further comprising a dichroic mirror that is configured between the light guide element and the second luminescent material.

12. The lighting device according to claim 1, wherein the first luminescent material is configured to provide one or more of green and yellow luminescent material light, wherein the second luminescent material is configured to provide red second luminescent material light, and wherein the lighting device is configured to provide white lighting device light.

13. A lighting system comprising one or more lighting devices according to claim 1, and a control system, wherein two or more luminescent elements are configured to provide luminescent material light with different spectral power distributions, and wherein the control system is configured to control one or more sets of light sources.

14. A projection system comprising the lighting device according to claim 1.

15. A luminaire comprising the lighting device according to claim 1.

\* \* \* \* \*